(12) United States Patent
Kishioka et al.

(10) Patent No.: US 7,425,399 B2
(45) Date of Patent: Sep. 16, 2008

(54) COMPOSITION FOR FORMING ANTI-REFLECTIVE COATING FOR USE IN LITHOGRAPHY

(75) Inventors: Takahiro Kishioka, Nei-gun (JP);
Ken-ichi Mizusawa, Chiyoda-ku (JP);
Tomoyuki Enomoto, Nei-gun (JP);
Rikimaru Sakamoto, Nei-gun (JP);
Keisuke Nakayama, Nei-gun (JP);
Yasuo Kawamura, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 274 days.

(21) Appl. No.: 10/530,349

(22) PCT Filed: Oct. 8, 2003

(86) PCT No.: PCT/JP03/12875

§ 371 (c)(1),
(2), (4) Date: Apr. 6, 2005

(87) PCT Pub. No.: WO2004/034148

PCT Pub. Date: Apr. 22, 2004

(65) Prior Publication Data

US 2006/0290429 A1 Dec. 28, 2006

(30) Foreign Application Priority Data

Oct. 9, 2002 (JP) .............................. 2002-295777
May 2, 2003 (JP) .............................. 2003-126886

(51) Int. Cl.
*G03C 1/825* (2006.01)
*C07D 251/30* (2006.01)
*C07D 251/72* (2006.01)

(52) U.S. Cl. .................................. 430/270.1; 544/221

(58) Field of Classification Search ........................ None
See application file for complete search history.

(56) References Cited

U.S. PATENT DOCUMENTS

| | | | |
|---|---|---|---|
| 4,874,860 | A | 10/1989 | Gallenkamp et al. |
| 5,250,591 | A | 10/1993 | Fujii et al. |
| 5,693,691 | A | 12/1997 | Flaim et al. |
| 5,919,599 | A | 7/1999 | Meador et al. |
| 6,284,428 | B1 | 9/2001 | Hirosaki et al. |
| 6,306,502 | B1 | 10/2001 | Fukushima et al. |
| 6,316,160 | B1 | 11/2001 | Shao et al. |
| 6,323,310 | B1 | 11/2001 | Puligadda et al. |
| 6,440,568 | B1 | 8/2002 | Kayanoki et al. |
| 2002/0055064 | A1 | 5/2002 | Iguchi et al. |
| 2004/0110089 | A1* | 6/2004 | Neef et al. |
| 2005/0175927 | A1 | 8/2005 | Kishioka et al. |

FOREIGN PATENT DOCUMENTS

| | | |
|---|---|---|
| EP | 0 098 006 | 1/1984 |
| EP | 0 869 154 A1 | 10/1998 |
| EP | 0 922 971 A1 | 6/1999 |
| EP | 1 298 492 A2 | 4/2003 |
| EP | 1 298 493 A2 | 4/2003 |
| EP | 1 542 075 A1 | 6/2005 |
| FR | 2 629 462 | 10/1989 |
| GB | 1 286 684 | 8/1972 |
| JP | A-05-255282 | 10/1993 |
| JP | A-10-186671 | 7/1998 |
| JP | A-10-204110 | 8/1998 |
| JP | A-11-511194 | 9/1999 |
| JP | A-11-279523 | 10/1999 |
| JP | A-2000-187331 | 7/2000 |
| WO | WO 02/086624 | 10/2002 |

OTHER PUBLICATIONS

Tom Lynch et al; "Properties and Performance of Near UV Reflectivity Control Layers"; *Advances in Resist Technology and Processing XI*, Omkaram Nalamasu ed., *Proceedings of SPIE*; vol. 2195; 1994; pp. 225-229.
G. Taylor et al.; "Methacrylate Resists and Antireflective Coatings for 193 nm Lithography"; *Microlithography 1999: Advances in Resist Technology and Processing XVI*, Will Conley ed., *Proceedings of SPIE*; vol. 3678; 1999; pp. 174-185.
Jim D. Meador et al.; "Recent Progress in 193 nm Antireflective Coatings"; *Microlithography 1999: Advances in Resist Technology and Processing XVI*, Will Conley ed., *Proceedings of SPIE*; vol. 3678; pp. 800-809.
Dirk Schmaljohann et al., "Design Strategies for 157 nm Single-Layer Photoresists: Lithographic Evaluation of a Poly($\alpha$-trifluoromethyl vinyl alcohol) Copolymer", *Advances in Resist Technology and Processing XVII*, Proceedings of SPIE, vol. 3999 pp. 330-334 (2000).
Michael K. Crawford et al., "New materials for 157 nm Photoresists: Characterization and Properties", *Advances in Resist Technology and Porcessing XVII*, Proceedings of SPIE, vol. 3999 pp. 357-364 (2000).
Kyle Patterson et al., "Polymers for 157 nm Photoresist Applications: A Progress Report", *Advances in Resist Technology and Processing XVII*, Proceedings of SPIE, vol. 3999 pp. 365-374 (2000).

* cited by examiner

*Primary Examiner*—Sin J. Lee
(74) *Attorney, Agent, or Firm*—Oliff & Berridge, PLC

(57) ABSTRACT

There is provided a composition for forming anti-reflective coating for anti-reflective coating that has a good absorption of light at a wavelength utilized for manufacturing a semiconductor device, that exerts a high protection effect against light reflection, that has a high dry etching rate compared with the photoresist layer. Concretely, the composition for forming anti-reflective coating contains a triazine trione compound, oligomer compound or polymer compound having hydroxyalkyl structure as substituent on nitrogen atom.

1 Claim, No Drawings

COMPOSITION FOR FORMING ANTI-REFLECTIVE COATING FOR USE IN LITHOGRAPHY

TECHNICAL FIELD

The present invention relates to a composition for forming anti-reflective coating, particularly to a composition for reducing a reflection of irradiation light for exposing a photoresist applied on a substrate from the substrate in a lithography process for manufacturing a semiconductor device, and more particularly to a composition for forming anti-reflective coating comprising a compound, an oligomer compound or a polymer compound that effectively absorbs reflection light from the substrate in a lithography process for manufacturing a semiconductor device by use of irradiation light for exposure with a wavelength of 248 nm, 193 nm or 157 nm.

BACKGROUND ART

Conventionally, in the manufacture of semiconductor devices, micro-processing by lithography using a photoresist composition has been carried out. The micro-processing is a processing method including forming a thin film of a photoresist composition on a semiconductor substrate such as a silicon wafer, irradiating actinic rays such as ultraviolet rays through a mask pattern on which a pattern for a semiconductor device is depicted, developing it to obtain a photoresist pattern, and etching the semiconductor substrate using the photoresist pattern as a protective film. However, in recent progress in high integration of semiconductor devices, there has been a tendency that shorter wavelength actinic rays are being used, i.e., ArF excimer laser beam (wavelength 193 nm) have been taking the place of i-line (wavelength 365 nm) or KrF excimer laser beam (wavelength 248 nm). Along with this change, influences of random reflection and standing wave off a substrate have become serious problems. Accordingly, it has been widely studied to provide an anti-reflective coating between the photoresist and the substrate (Bottom Anti-Reflective Coating, BARC).

As the anti-reflective coating, inorganic anti-reflective coatings made of titanium, titanium dioxide, titanium nitride, chromium oxide, carbon or α-silicon and organic anti-reflective coatings made of a light-absorbing substance and a polymer compound are known. The former requires an installation such as a vacuum deposition apparatus, a CVD (chemical vapor deposition) apparatus or a sputtering apparatus. In contrast, the latter is considered advantageous in that it requires no special installation so that many studies have been made. For example, mention may be made of the acrylic resin type anti-reflective coating having a hydroxyl group being a crosslinking reaction group and a light absorbing group in the same molecule and the novolak resin type anti-reflective coating having a hydroxyl group being a crosslinking reaction group and a light absorbing group in the same molecule (see, for example U.S. Pat. Nos. 5,919,599 and 5,693,691).

The physical properties desired for organic anti-reflective coating materials include high absorbance to light and radioactive rays, no intermixing with the photoresist layer (being insoluble in photoresist solvents), no diffusion of low molecular substances from the anti-reflective coating material into the topcoat resist upon coating or heat-drying, and a higher dry etching rate than the photoresist (see, for example, Tom Lynch et al., "Properties and Performance of Near UV Reflectivity Control Layers", US, in Advances in Resist Technology and Processing XI, Omkaram Nalamasu ed., Proceedings of SPIE, 1994, Vol. 2195, p. 225-229; G. Taylor et al., "Methacrylate Resist and Antireflective Coatings for 193 nm Lithography", US, in Microlithography 1999: in Advances in Resist Technology and Processing XVI, Will Conley ed., Proceedings of SPIE, 1999, Vol. 3678, p. 174-185; and Jim D. Meador et al., "Recent Progress in 193 nm Antireflective Coatings, US, in Microlithography 1999: in Advances in Resist Technology and Processing XVI, Will Conley ed., Proceedings of SPIE, 1999, Vol. 3678, p. 800-809).

In recent years, miniaturization of process dimension in lithography process by use of KrF excimer laser beam or ArF excimer laser beam, that is, miniaturization of photoresist pattern to be formed is progressing. With the progress in the miniaturization of photoresist pattern, it is desired to make photoresist thinner in order to avoid collapse of photoresist pattern. When the photoresist is used in a form of thin film, it is desired that an organic anti-reflective coating used together with it can be removed for a short time in order to depress reduction in film thickness of the photoresist layer in a step of removing the organic anti-reflective coating by etching. That is, for reduction in time for etching removing step, it is required that any organic anti-reflective coating can be used in a form of thinner film, or that the organic anti-reflective coating has a larger selection ratio of etching rate with photoresist than the prior one.

By the way, a hitherto technique of anti-reflective coatings has been mainly considered on lithography process with irradiation light having a wavelength of 365 nm, 248 nm or 193 nm. As a result of such consideration, light absorbing components and light absorbing groups effectively absorbing light of each wavelength are developed, and they come to be utilized as one component of an organic anti-reflective coating composition. For example, it is known that chalcone dies prepared by condensation of 4-hydroxyacetophenone with 4-methoxybenzaldehyde are effective for irradiation light having a wavelength of 365 nm (see, for example Japanese Patent Laid-open No. Hei 11-511194), it is known that naphthalene group-containing polymers having a specific structure have high absorbance for irradiation light having a wavelength of 248 nm (see, for example Japanese Patent Laid-open No. Hei 10-186671), and it is known that resin binder compositions containing phenyl unit are excellent for irradiation light having a wavelength of 193 nm (see, for example Japanese Patent Laid-open No. 2000-187331).

In addition, it is known that tris(hydroxyalkyl)isocyanurate substituted with aromatic compound or alicyclic compound is used as a broad UV absorber (see, for example Japanese Patent Laid-open No. Hei 11-279523), and that a curing composition contains cyanuric acid as a polymerizable organic compound (see, for example Japanese Patent Laid-open No. Hei 10-204110). An anti-reflective coating composition containing cyanuric acid derivative is also known (see, for example WO 02/086624). Further, it is disclosed that a polyester synthesized from 1,3,5-tris(2-hydroxyethyl)cyanuric acid is used for an anti-reflective coating (see, for example EP 1298492 A and EP 1298493 A).

In recent years, lithography process with F2 excimer laser (wavelength 157 nm) being a light source having a shorter wavelength comes to be regarded as next-generation technology in place of that with ArF excimer laser (wavelength 193 nm). It is considered that the former process permits micro-processing of process dimension not more than 100 nm, and at present its development and research have been actively carried out from the aspects of apparatus and material, etc. However, most of the research on material relate to photoresist, and it is an actual condition that the research on organic anti-reflective coatings is little known. This is because components effectively absorbing light having a wavelength of 157 nm, that is light absorbing components having a strong absorption band at 157 nm are little known.

It is considered that as irradiation light provides process dimension not more than 100 nm. Therefore, it is also considered that a photoresist is used in a form of thin film having a thickness of 100 to 300 nm that is thinner compared with the prior one. Organic anti-reflective coatings used along with such a photoresist in a form of thin film require the followings: they can be used in a form of a thin film; and they have a high selectivity of dry etching for photoresist. And, it is considered that organic anti-reflective coatings are required to have a large attenuation coefficient k so that they could be used in a shape of thin film having a thickness of 30 to 80 nm. In a simulation with PROLITH ver. 5 (manufactured by Litho Tech Japan; expected and ideal values are used as optical constants (refractive index, attenuation coefficient) of the photoresist), an anti-reflective coating having a base substrate made of silicon with a thickness of 30 to 80 nm can have second minimum thickness (about 70 nm), and in this case the coating has an attenuation coefficient k of 0.3 to 0.6 and a reflectance from substrate of 2% or less, thus has a sufficient anti-reflective effect. In addition, a similar simulation in which silicon oxide is used as base substance and a thickness of silicon oxide varies between 100 nm and 200 nm results in that attenuation coefficient k of 0.4 to 0.6 is required in order to exert a sufficient anti-reflective effect with an anti-reflective coating having a thickness of 70 nm. For example, in case where attenuation coefficient k is 0.2, reflectance from substrate varies between 5% and 10%, and in case where attenuation coefficient k is 0.4, reflectance from substrate varies between 0% and 5%. Consequently, it is considered that in order to exert a sufficient anti-reflective effect, a high attenuation coefficient k, for example 0.3 or more is required. However, any material for organic anti-reflective coatings satisfying such an attenuation coefficient k have been little known.

Under such circumstances, it is demanded to develop organic anti-reflective coatings efficiently absorbing reflection light from a substrate and thereby having an excellent anti-reflective effect. Further, photoresists for lithography process for which irradiation light from F2 excimer laser are used are actively examined at present, and therefore it is considered that many kinds of photoresists will be developed in future. And, it is considered that a method of changing attenuation coefficient so as to suit required characteristics of each photoresist, for example a method of changing attenuation coefficient k comes to be important.

The present invention relates to a composition for forming anti-reflective coating, which has a strong absorption of light at a short wavelength, particularly light at wavelength of 248 nm, 193 nm or 157 nm. In addition, the present invention provides a composition for forming anti-reflective coating, which can be used in a lithography process for manufacturing a semiconductor device carried out by using irradiation light from KrF excimer laser (wavelength 248 nm), ArF excimer laser beam (wavelength 193 nm) or F2 excimer laser (wavelength 157 nm). Further, the present invention provides an anti-reflective coating for lithography which effectively absorbs reflection light from a substrate when irradiation light from KrF excimer laser, ArF excimer laser beam or F2 excimer laser is used for micro-processing, and which causes no intermixing with photoresist layer, can be rapidly removed in the following removal step, and has a high dry etching rate compared with the photoresists. In addition, the present invention provides a method of forming an anti-reflective coating for lithography by using the composition for forming anti-reflective coating, and a method of forming a photoresist pattern.

DISCLOSURE OF INVENTION

The present invention relates to the following aspects:

as a first aspect, a composition for forming anti-reflective coating characterized in that the composition comprises a triazine trione compound having hydroxyalkyl structure as substituent on nitrogen atom, a triazine trione oligomer compound having hydroxyalkyl structure as substituent on nitrogen atom, or a triazine trione polymer compound having hydroxyalkyl structure as substituent on nitrogen atom;

as a second aspect, the composition for forming anti-reflerctive coating as described in the first aspect, wherein the triazine trione compound having hydroxalkyl structure as substituent in nitrogen atom is a compound of formula (1);

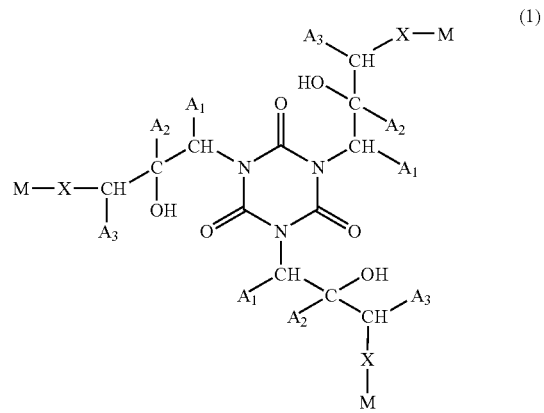

wherein $A_1$, $A_2$ and $A_3$ are independently of one another hydrogen atom, methyl or ethyl, X is —OC(=O)—, —S—, —O— or —NR— wherein R is hydrogen atom or methyl, M is benzene ring, naphthalene ring or anthracene ring which may be substituted with $C_{1-6}$ alkyl, phenyl, naphthyl, halogen atom, $C_{1-6}$ alkoxycarbonyl, nitro, cyano, $C_{1-6}$ alkoxy or $C_{1-6}$ alkylthio;

as a third aspect, the composition for forming anti-reflective coating as described in the first aspect, wherein the triazine trione compound having hydroxyalkyl structure as substituent on nitrogen atom, the triazine trione oligomer compound having hydroxyalkyl structure as substituent on nitrogen atom, or the triazine trione polymer compound having hydroxyalkyl structure as substituent on nitrogen atom is a triazine trione compound having a substituent of formula (2) or (3) as substituent on nitrogen atom, or a triazine trione oligomer compound or triazine trione polymer compound having a structure in which at least two triazine trione rings are linked through a linking group of formula (4) or (5) on the nitrogen atoms:

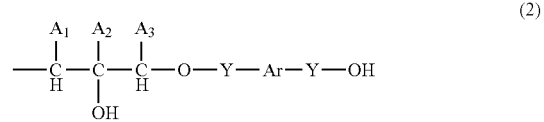

-continued

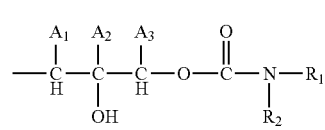
(3)

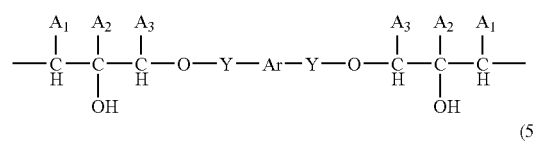
(4)

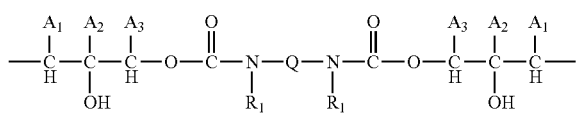
(5)

wherein $A_1$, $A_2$ and $A_3$ have the same meaning above, Y is a direct bond or —C(=O)—, Ar is benzene ring or naphthalene ring which may be substituted with $C_{1-6}$ alkyl, phenyl, naphthyl, halogen atom, $C_{1-6}$ alkoxycarbonyl, nitro, carboxy, cyano, $C_{1-6}$ alkoxy, hydroxy, thiol, $C_{1-6}$ alkylthio or amino, Q is $C_{1-6}$ alkyl, $C_{5-8}$ cycloalkyl, Ar or —CH$_2$—Ar—CH$_2$—, $R_1$ is $C_{1-6}$ alkyl, phenyl or benzyl, $R_2$ is hydrogen atom, $C_{1-6}$ alkyl, phenyl or benzyl;

as a fourth aspect, the composition for forming anti-reflective coating as described in the third aspect, wherein the triazine trione compound having a substituent of formula (2) or (3) has a structure of formula (6) or (7):

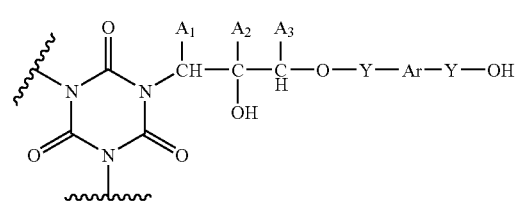
(6)

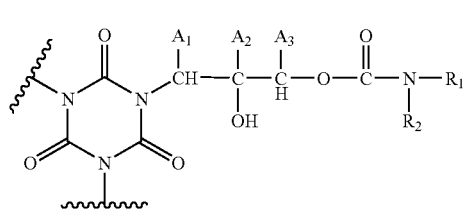
(7)

wherein $A_1$, $A_2$, $A_3$, Y, Ar, $R_1$ and $R_2$ have the same meaning above;

as a fifth aspect, the composition for forming anti-reflective coating as described in the third aspect, wherein the triazine trione oligomer compound or triazine trione polymer compound having a structure in which at least two triazine trione rings are linked through a linking group of formula (4) or (5) on the nitrogen atoms has a structure of formula (8) or (9):

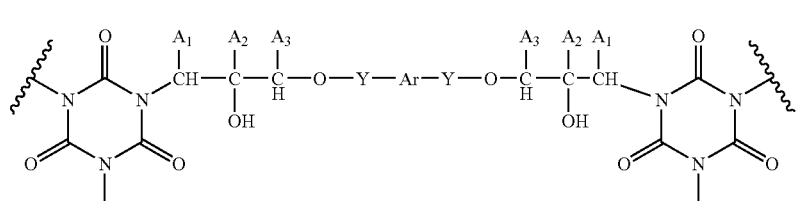
(8)

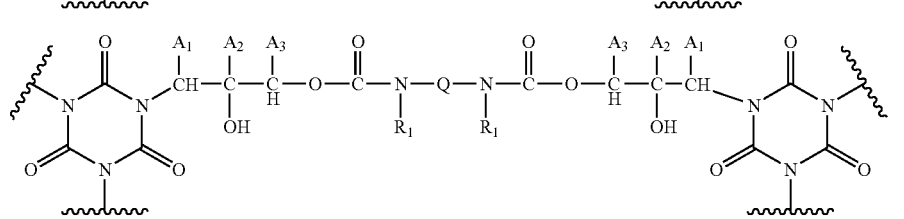
(9)

wherein $A_1$, $A_2$, $A_3$, Y, Ar, Q, $R_1$ and $R_2$ have the same meaning mentioned above;

as a sixth aspect, the composition for forming anti-reflective coating as described in the first aspect, wherein the triazine trione oligomer compound having hydroxyalkyl structure as substituent on nitrogen atom, or triazine trione polymer compound having hydroxyalkyl structure as substituent on nitrogen atom is a reaction product of a compound of formula (10) with a compound of formula (11) or (12):

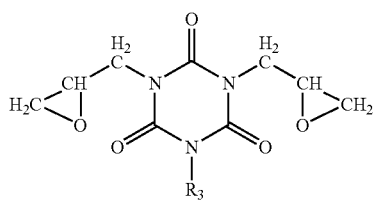
(10)

-continued

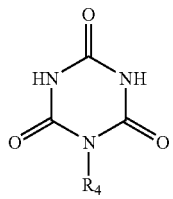
(11)

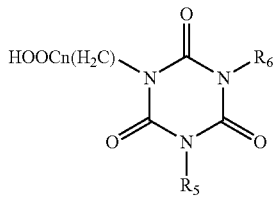
(12)

wherein $R_3$ is $C_{1-6}$ alkyl, $C_{3-6}$ alkenyl, phenyl, benzyl or 2,3-epoxypropyl, $R_4$ and $R_5$ are $C_{1-6}$ alkyl, $C_{3-6}$ alkenyl, phenyl or benzyl, $R_6$ is $C_{1-6}$ alkyl, phenyl, benzyl or —$(CH_2)_n$COOH, and n is a number of 1, 2 or 3;

as a seventh aspect, the composition for forming anti-reflective coating as described in the third aspect, wherein the triazine trione compound having a substituent of formula (2) as substituent on nitrogen atom, or the triazine trione oligomer compound or triazine trione polymer compound having a structure in which at least two triazine trione rings are linked through a linking group of formula (4) on the nitrogen atoms is produced from a triazine trione compound having at least two nitrogen atoms having a substituent of formula (13) on nitrogen atom and a phenyl compound or naphthalene compound of formula (14) having at least two substituents selected from carboxy and hydroxy which are identical or different from each other

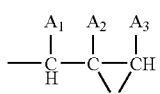
(13)

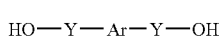
(14)

wherein $A_1$, $A_2$, $A_3$, Y and Ar have the same meaning above;

as an eighth aspect, the composition for forming anti-reflective coating as described in seventh aspect, wherein triazine trione compound having at least two nitrogen atoms having a substituent of formula (13) on nitrogen atom is a triazine trione compound of formula (15)

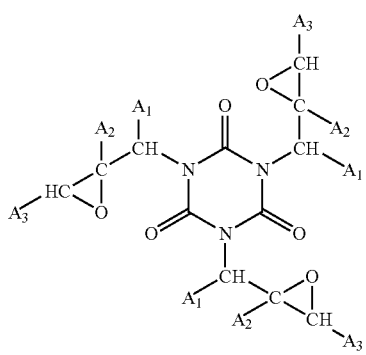
(15)

wherein $A_1$, $A_2$ and $A_3$ have the same meaning above;

as a ninth aspect, the composition for forming anti-reflective coating as described in the seventh aspect, wherein the phenyl compound or naphthalene compound of formula (14) is at least one compound selected from the group consisting of compounds of formulae (16) to (21)

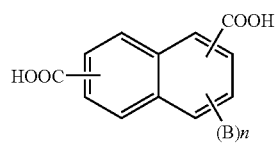
(16)

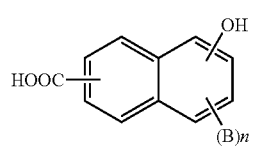
(17)

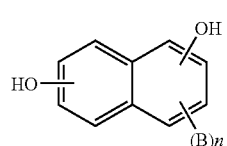
(18)

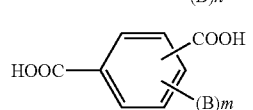
(19)

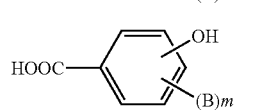
(20)

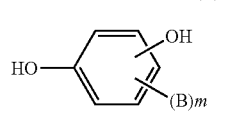
(21)

wherein B is hydrogen atom, $C_1$, alkyl, phenyl, naphthyl, halogen atom, $C_{1-6}$ alkoxycarbonyl, nitro, carboxy, cyano, $C_{1-6}$ alkoxy, hydroxy, thiol, $C_{1-6}$ alkylthio or amino, n is a number of 1 to 6, m is a number of 1 to 4, and B may be identical with or different from each other in case where n or m is 2 or more;

as a tenth aspect, the composition for forming anti-reflective coating as described in any one of the first to ninth aspects, further containing a crosslinking agent having at least two crosslink-forming substituents;

as an eleventh aspect, the composition for forming anti-reflective coating as described in any one of the first to tenth aspects, further containing an acid and/or an acid generator;

as a twelfth aspect, the composition for forming anti-reflective coating as described in any one of the first to eleventh aspects, further containing a resin having at least one crosslinking-forming substituent selected from hydroxy, carboxy, amino and thiol;

as a thirteenth aspect, an anti-reflective coating produced by coating the composition for forming anti-reflective coating as described in any one of the first to twelfth aspects on a semiconductor substrate, and baking it, wherein the anti-reflective coating has an attenuation coefficient k to a light at a wavelength of 248 nm ranging from 0.40 to 0.65;

as a fourteenth aspect, an anti-reflective coating produced by coating the composition for forming anti-reflective coating as described in any one of the first to twelfth aspects on a semiconductor substrate, and baking it, wherein the anti-reflective coating has an attenuation coefficient k to a light at a wavelength of 157 nm ranging from 0.20 to 0.50;

as a fifteenth aspect, an anti-reflective coating produced by coating the composition for forming anti-reflective coating as described in any one of the first to twelfth aspects on a semiconductor substrate, and baking it, wherein the anti-reflective coating has an attenuation coefficient k to a light at a wavelength of 193 nm ranging from 0.20 to 0.60;

as a sixteenth aspect, a method of forming an anti-reflective coating for use in a manufacture of a semiconductor device, comprising the steps of: coating the composition for forming anti-reflective coating as described in any one of the first to twelfth aspects on a substrate, and baking it;

as a seventeenth aspect, a method of forming an anti-reflective coating for use in a manufacture of a semiconductor device by use of a light of wavelength 248 nm, 193 nm or 157 nm, comprising the steps of: coating the composition for forming anti-reflective coating as described in any one of the first to twelfth aspects on a substrate, and baking it;

as an eighteenth aspect, a method of forming a photoresist pattern for use in a manufacture of a semiconductor device comprising the steps of:
  coating the composition for forming anti-reflective coating as described in any one of the first to twelfth aspects on a semiconductor substrate and baking it to form an anti-reflective coating,
  forming a photoresist layer on the anti-reflective coating,
  exposing the semiconductor substrate covered with the anti-reflective coating and the photoresist layer with a light, and
  developing the exposed photoresist layer; and as a nineteenth aspect, the method of forming a photoresist pattern as described in the eighteenth aspect, wherein the exposure is carried out with a light of wavelength 248 nm, 193 nm or 157 nm.

BEST MODE FOR CARRYING OUT THE INVENTION

The present invention relates to a composition for forming anti-reflective coating characterized in that the composition comprises a triazine trione compound having hydroxyalkyl structure as substituent on nitrogen atom, a triazine trione oligomer compound having hydroxyalkyl structure as substituent on nitrogen atom, or a triazine trione polymer compound having hydroxyalkyl structure as substituent on nitrogen atom. In addition, the present invention relates to a composition for forming anti-reflective coating, which can be used in lithography process for manufacturing a semiconductor device by use of irradiation light of a short wavelength, particularly irradiation light of KrF excimer laser (wavelength 248 nm), ArF excimer laser (wavelength 193 nm) or F2 excimer laser (wavelength 157 nm).

The composition for forming anti-reflective coating according to the present invention basically comprises a triazine trione compound having hydroxyalkyl structure as substituent on nitrogen atom, a triazine trione oligomer compound having hydroxyalkyl structure as substituent on nitrogen atom, or a triazine trione polymer compound having hydroxyalkyl structure as substituent on nitrogen atom, and a solvent; and as arbitrary component a catalyst for crosslinking, a surfactant and the like. The composition for forming anti-reflective coating according to the present invention contains 0.1 to 50 mass %, for example 0.5 to 30 mass % of solid content. In this specification, the solid content means components other than the solvent in the composition for forming anti-reflective coating.

The triazine trione compound having hydroxyalkyl structure as substituent on nitrogen atom, triazine trione oligomer compound having hydroxyalkyl structure as substituent on nitrogen atom, or triazine trione polymer compound having hydroxyalkyl structure as substituent on nitrogen atom in the composition for forming anti-reflective coating according to the present invention is contained in an amount of 10 mass % or more, for example 30 mass % to 99 mass %, for example 50 mass % to 99 mass %, and further 60 mass % to 95 mass % per 100 mass % of the total solid content.

In the composition for forming anti-reflective coating according to the present invention, as the triazine trione compound having hydroxyalkyl structure as substituent on nitrogen atom, the compound of formula (1) may be mentioned. In formula (1), $A_1$, $A_2$ and $A_3$ are independently of one another hydrogen atom, methyl or ethyl, X is —OC(=O)—, —S—, —O— or —NR— wherein R is hydrogen atom or methyl, M is benzene ring, naphthalene ring or anthracene ring which may be substituted with $C_{1-6}$ alkyl, phenyl, naphthyl, halogen atom, $C_{1-6}$ alkoxycarbonyl, nitro, cyano, $C_{1-6}$ alkoxy or $C_{1-6}$ alkylthio.

The compound of formula (1) can be obtained, for example by the reaction of a compound of formula (15) with a compound of formula (22):

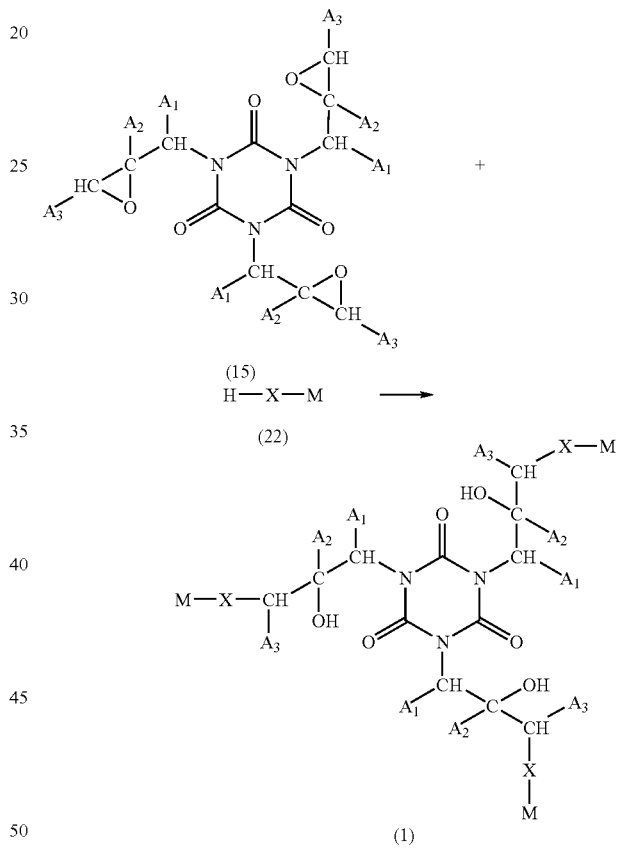

wherein X is —OC(=O)—, —S—, —O— or —NR— wherein R is hydrogen atom or methyl, M is benzene ring, naphthalene ring or anthracene ring which may be substituted with $C_{1-6}$ alkyl, phenyl, naphthyl, halogen atom, $C_{1-6}$ alkoxycarbonyl, nitro, cyano, $C_{1-6}$ alkoxy or $C_{1-6}$ alkylthio.

The reaction of the compound of formula (15) with the compound of formula (22) is preferably carried out in a solution state in which they are dissolved in an organic solvent such as benzene, toluene, xylene, ethyl lactate, butyl lactate, propylene glycol monomethyl ether, propylene glycol monomethyl ether acetate, N-methyl pyrrolidone or the like. In the reaction, the compound of formula (15) with the compound of formula (22) can be used in only one compound, respectively, or in a combination of two or more. In addition, in the reaction, quaternary ammonium salt such as benzyl triethyl ammonium chloride, tetrabutyl ammonium chloride, tetraethyl ammonium bromide or the like can be used as a catalyst for the reaction. The reaction temperature and reaction time depend on the compounds to be used or the concentration thereof or the like, but the reaction time is suitably selected from 0.1 to 100 hours, and the reaction temperature is suitably selected from 20° C. to 200° C. When the catalyst is used, it may be used in an amount of 0.001 to 50 mass % based on the total mass of used compounds.

In the composition for forming anti-reflective coating containing the compound of formula (1) according to the present invention, the characteristics of the anti-reflective coating formed from the composition for forming anti-reflective coating, particularly light absorption characteristics, attenuation coefficient, refractive index and the like to irradiation light used for lithography process largely depend on the kind of the compound of formula (22) used. The kind of the compound of formula (22) used affects the time required for the removal step of the anti-reflective coating formed from the composition for forming anti-reflective coating according to the present invention by etching. In particular, the kind and number of substituents on benzene ring, naphthalene ring or anthracene ring on the compound of formula (22) affect the time required for the removal step of anti-reflective coating by etching. The introduction of substituent containing hetero atom such as halogen atom, nitrogen atom, oxygen atom, sulfur atom or the like, or the increase in the number thereof can make possible to reduce time required for the removal step by etching.

In case where the composition for forming anti-reflective coating containing the compound of formula (1) according to the present invention is applied for a process with a light of wavelength 248 nm (KrF excimer laser), the compound of formula (22) having naphthalene ring or anthracene ring (M is naphthalene ring or anthracene ring) is preferably used. In addition, in case where it is applied for a process with a light of wavelength 193 nm (ArF excimer laser) or wavelength 157 nm (F2 excimer laser), the compound having benzene ring (M is benzene ring) is preferably used.

The compound of formula (15) used for obtaining the compound of formula (1) includes for example tris-(2,3-epoxypropyl)-isocyanurate, tris-(2-methyl-2,3-epoxypropyl)-isocyanurate, tris-(2,3-epoxybutyl)-isocyanurate, or the like.

The compound of formula (22) used for obtaining the compound of formula (1) includes for example benzoic acid, monoethyl isophthalate, 2,4-dibromobenzoic acid. 4-methylbenzoic acid, 2-methoxybenzoic acid, 2,3,5-triiodo benzoic acid, 2-chloro-4-nitorbenzoic acid, 4-fluorobenzoic acid, 4-iodobenzoic acid, 4-bromobenzoic acid, 4-t-butylbenzoic acid, 3-trifluoromethylbenzoic acid, 2-nitrobenzoic acid, 4-isopropoxybenzoic acid, 3-cyanobenzoic acid, 3-phenylbenzoic acid, 3-bromo-4-methylbenzoic acid, 2,4,6-tribromobenzoic acid, 4-methylthiobenzoic acid, 2-bromo-4-fluorobenzoic acid or the like.

In addition, the compound of formula (22) includes for example naphthalene-2-carboxylic acid, 1-bromonaphthalene-2-carboxylic acid, 4-bromo-3-methoxy-naphthalene-2-carboxylic acid, 3-methylnaphthalene-2-carboxylic acid, 4-fluoro naphthalene-1-carboxylic acid, 4-nitoronaphthalene-1-carboxylic acid, 5-bromo naphthalene-1-carboxylic acid, 8-iodonaphthalene-1-carboxylic acid, anthracene-9-carboxylic acid, anthracene-2-carboxylic acid, 10-bromoanthracene-9-carboxylic acid or the like.

Further, the compound of formula (22) includes for example phenol, 4-methylphenol, 4-chlorophenol, 4-bromophenol, 4-nitrophenol, 2,3,4,5-tetrabromophenol, pentabromophenol, 4-bromo-2-fluorophenol, 4-iodophenol, 2,4,6-triiodophenol, 2,5-dimethyl-4-iodophenol, 4-methylthiophenol, 3-methoxyphenol, 3-bromophenol, 2-cyanophenol, 2,6-diiodo-4-cyanophenol, 3-hydroxy methyl benzoate, 2-naphthol, 1-bromo-2-naphthol, 2-nitro-1-naphthol, 2-methyl-1-naphthol, 4-methoxy-1-naphthol, 2,4-dichloro-1-naphthol, 2-hydroxynaphthalnene-3-carboxylic acid methyl ester, 2-hydroxyanthracene, 9-hydroxyanthracene or the like.

In addition, the compound of formula (22) includes for example aniline, 3-chloroaniline, 2-bromoaniline, 4-iodoaniline, 3-methoxyaniline, 3-methylthioaniline, 4-nitroaniline, 3-isopropylaniline, 3,5-dibromoaniline, 2-fluoro-4-iodoaniline, 2-amino-5-iodobenzoic acid methyl ester, 2,4,6-tribromoaniline, 4-bromo-3-methylaniline, 2-bromo-4-nitroaniline, 2-bromo-5-trifluoromethylaniline, 3-phenylaniline, 1-aminonaphthalene, 1-amino-4-bromonaphthalene, 1-amino-2-nitronaphthalene, 1-aminoanthracene, 9-aminoanthracene or the like.

Further, the compound of formula (22) includes for example thiophenol, 2-methylthiophenol, 4-chlorothiophenol, pentachlorothiophenol, 3-methoxythiophenol, 3-bromothiophenol, 2-mercaptobenzoic acid methyl ester, 4-nitrothiophenol, 3-iodothiophenol, 1-naphthalenethiol, 9-mercaptoanthracene or the like.

In addition, as compounds to be reacted with the compound of formula (8) include, in addition to the compounds of formula (15), for example compounds having carboxy or hydroxy, such as thiophen-2-carboxylic acid, 5-bromothiophen-2-carboxylic acid, phenylacetic acid, 4-bromophenoxy acetic acid, benzyl alcohol, 2,4-dibromobenzylalcohol, 3-bromo cinnamic acid, 9-hydroxymethylanthracene, thiazole-2-carboxylic acid, 2-amino-5-bromothiazole can be used.

As the compound of formula (1) contained in the composition for forming anti-reflective coating according to the present invention, for example the compound of formula (23) (Compound No. 1 in Table 1 below) and the compound of formula (24) (Compound No. 15 in Table 1 below) may be mentioned:

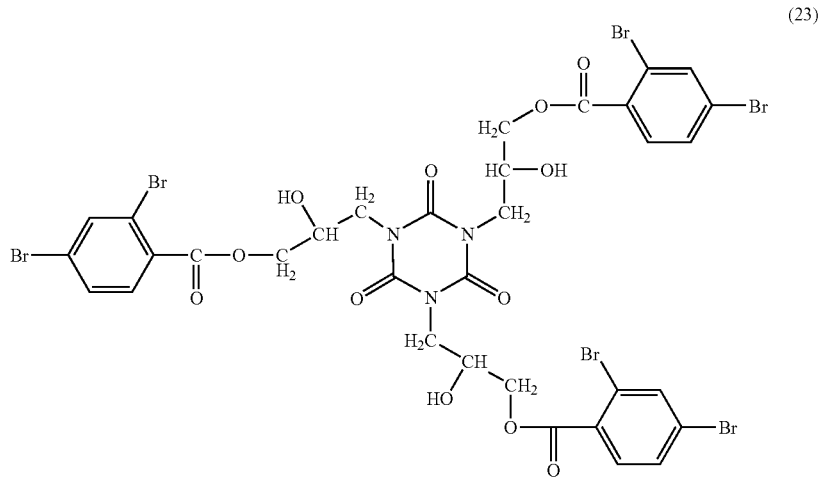

(23)

-continued

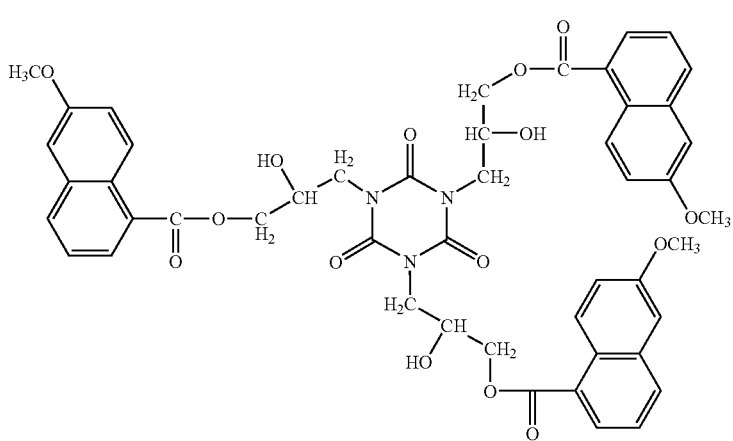

(24)

Similarly, the compounds shown in Table 1 may be mentioned (in Table, Ph means phenyl, 1-Nap means 1-naphthyl, 2-Nap means 2-naphthyl, and 9-Ant means 9-anthryl).

TABLE 1

| Compound No. | A1 | A2 | A3 | X | M |
|---|---|---|---|---|---|
| 1 | H | H | H | OC(=O) | Ph-2,4-(Br)$_2$ |
| 2 | H | H | H | OC(=O) | Ph |
| 3 | H | H | H | OC(=O) | Ph-4-NO$_2$ |
| 4 | H | CH$_3$ | H | OC(=O) | Ph |
| 5 | H | H | H | OC(=O) | Ph-3-CN |
| 6 | H | H | H | OC(=O) | Ph-3-CH$_3$ |
| 7 | H | H | H | OC(=O) | Ph-2-OCH$_3$ |
| 8 | H | H | H | OC(=O) | Ph-2,3,5-(I)$_3$ |
| 9 | H | CH$_3$ | H | OC(=O) | Ph-3-Br-5-I |
| 10 | H | H | H | OC(=O) | Ph-2,3,4,5-(I)$_4$ |
| 11 | H | H | H | OC(=O) | Ph-3-SCH$_3$ |
| 12 | H | H | H | OC(=O) | Ph-2,4-(Cl)$_3$ |
| 13 | H | H | H | OC(=O) | Ph-2-Br-4-CH$_3$ |
| 14 | H | H | H | OC(=O) | Ph-3-Br-5-I |
| 15 | H | H | H | OC(=O) | 1-Nap-6-OCH$_3$ |
| 16 | H | H | H | OC(=O) | 2-Nap-3-CH$_3$ |
| 17 | H | CH$_3$ | H | OC(=O) | 1-Nap |
| 18 | H | H | H | OC(=O) | 2-Nap-6-F |
| 19 | H | H | H | OC(=O) | 9-Ant |
| 20 | H | H | H | OC(=O) | 9-Ant-10-Br |
| 21 | H | H | H | S | Ph-4-F |
| 22 | H | H | H | S | Ph |
| 23 | H | H | H | S | Ph-3-CH$_3$ |
| 24 | H | H | H | S | Ph-2,4-(Cl)$_3$ |
| 25 | H | H | H | S | Ph-2,4-(Br)$_2$ |
| 26 | H | H | H | S | 1-Nap |
| 27 | H | H | H | S | 2-Nap-6,7-(Br)$_2$ |
| 28 | H | H | H | S | 9-Ant |
| 29 | H | H | H | NH | Ph |
| 30 | H | CH$_3$ | H | NH | Ph |
| 31 | H | H | H | NH | Ph-4-CH$_3$ |
| 32 | H | H | H | NH | Ph-2-Br |
| 33 | H | H | H | NH | Ph-3,5-(Br)$_2$ |
| 34 | H | H | H | NH | Ph-3-CN |
| 35 | H | H | H | NH | Ph-3-COOCH$_3$ |
| 36 | H | H | H | NH | Ph-3,4,5-(Cl)$_3$ |
| 37 | H | H | H | NH | Ph-4-SCH$_3$ |
| 38 | H | H | H | NH | Ph-2-F-4-Cl |
| 39 | H | H | H | NH | Ph-3-CH$_3$ |
| 40 | H | H | H | NH | 1-Nap |
| 41 | H | H | H | O | Ph-2-Br |
| 42 | H | CH$_3$ | H | O | Ph |
| 43 | H | H | H | O | Ph-2,4-Br$_2$ |
| 44 | H | H | H | O | Ph-4-CH$_3$ |
| 45 | H | H | H | O | Ph-3-I |

TABLE 1-continued

| Compound No. | A1 | A2 | A3 | X | M |
|---|---|---|---|---|---|
| 46 | H | H | H | O | Ph-2-F |
| 47 | H | H | H | O | Ph-3-OCH$_3$ |
| 48 | H | H | H | O | Ph-3-NO$_2$ |
| 49 | H | H | H | O | 1-Nap-2-Cl |
| 50 | H | CH$_3$ | H | O | 1-Nap |
| 51 | H | H | H | O | 2-Nap |
| 52 | H | H | H | O | 9-Ant |

In the composition for forming anti-reflective coating according to the present invention, the compound of formula (1) may be used alone or in a mixture of two or more. The content of the compound of formula (1) is 10 mass % or more, for example 30 mass % to 99 mass %, for example 50 mass % to 99 mass %, further for example 60 to 95 mass % in the total solid content.

In the composition for forming anti-reflective coating according to the present invention, as the triazine trione compound having hydroxyalkyl structure as substituent on nitrogen atom, a triazine trione compound having a substituent of formula (2) or (3) as substituent on nitrogen atom, or a triazine trione oligomer compound or triazine trione polymer compound having a structure in which at least two triazine trione rings are linked through a linking group of formula (4) or (5) on the nitrogen atoms may be mentioned. In formula (2), (3), (4) or (5), $A_1$, $A_2$ and $A_3$ are independently of one another hydrogen atom, methyl or ethyl, Y is a direct bond or —C(=O)—, Ar is benzene ring or naphthalene ring which may be substituted with $C_{1-6}$ alkyl, phenyl, naphthyl, halogen atom, $C_{1-6}$ alkoxycarbonyl, nitro, carboxy, cyano, $C_{1-6}$ alkoxy, hydroxy, thiol, $C_{1-6}$ alkylthio or amino, Q is $C_{1-6}$ alkyl, $C_{5-8}$ cycloalkyl, Ar or —CH$_2$—Ar—CH$_2$—, $R_1$ is $C_{1-6}$ alkyl, phenyl or benzyl, $R_2$ is hydrogen atom, $C_{1-6}$ alkyl, phenyl or benzyl.

As the triazine trione compound having a substituent of formula (2), the compounds having a structure of formula (6) can be used. In formula (6), $A_1$, $A_2$ and $A_3$ are independently of one another hydrogen atom, methyl or ethyl, Y is a direct bond or —C(=O)—, Ar is benzene ring or naphthalene ring which may be substituted with $C_{1-6}$ alkyl, phenyl, naphthyl, halogen atom, $C_{1-6}$ alkoxycarbonyl, nitro, carboxy, cyano, $C_{1-6}$ alkoxy, hydroxy, thiol, $C_{1-6}$ alkylthio or amino.

The compound of formula (6) can be obtained by reacting a triazine trione compound having on nitrogen atom a substituent of formula (13):

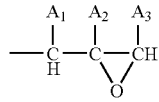

(13)

wherein $A_1$, $A_2$ and $A_3$ are independently of one another hydrogen atom, methyl or ethyl, with a phenyl compound or a naphthalene compound of formula (14):

HO—Y—Ar—Y—OH (14)

wherein Y is a direct bond or —C(=O)—, Ar is benzene ring or naphthalene ring which may be substituted with $C_{1-6}$ alkyl, phenyl, naphthyl, halogen atom, $C_{1-6}$ alkoxycarbonyl, nitro, carboxy, cyano, $C_{1-6}$ alkoxy, hydroxy, thiol, $C_{1-6}$ alkylthio or amino. In this reaction, the compound of formula (14) can be used alone or in a combination of two or more. The reaction is preferably carried out in a solution state in which they are dissolved in an organic solvent such as benzene, toluene, xylene, ethyl lactate, butyl lactate, propylene glycol monomethyl ether, propylene glycol monomethyl ether acetate, N-methyl pyrrolidone or the like. In addition, quaternary ammonium salt such as benzyl triethyl ammonium chloride, tetrabutyl ammonium chloride, tetraethyl ammonium bromide or the like can be used as a catalyst for the reaction. The reaction temperature and reaction time depend on the compounds to be used or the concentration thereof or the like, but the reaction time is suitably selected from 0.1 to 100 hours, and the reaction temperature is suitably selected from 20° C. to 200° C. When the catalyst is used, it may be used in an amount of 0.001 to 50 mass % based on the total mass of used compounds.

In the triazine trione compound having the substituent of formula (13), compounds having one, two or three nitrogen atoms having the substituent of formula (13) on nitrogen atom are assumed, all of them can be used in this reaction or they can be used in a combination of them. The compounds having three substituents of formula (13), that is, the compound of formula (15) is preferably used. The compounds of formula (15) wherein $A_1$, $A_2$ and $A_3$ are hydrogen atom, methyl or ethyl, wherein $A_1$, $A_2$ and $A_3$ are hydrogen, and wherein $A_1$ and $A_3$ are hydrogen atom and $A_2$ is methyl are preferably used.

When the triazine trione compound having two or three nitrogen atoms having the substituent of formula (13) is used, it is assumed that all substituents of them are reacted with the compound of formula (14) or only one or two substituents are reacted with the compound of formula (14). The present invention include both cases. In the composition for forming anti-reflective coating according to the present invention, the compounds obtained by reacting all substituents in the compound (15) having three substituents of formula (13) with the compound of formula (14) are preferably used, and the compound of formula (25) is preferably used. In formula (25), Y is a direct bond or —C(=O)—, Ar is benzene ring or naphthalene ring which may be substituted with $C_{1-6}$ alkyl, phenyl, naphthyl, halogen atom, $C_{1-6}$ alkoxycarbonyl, nitro, carboxy, cyano, $C_{1-6}$ alkoxy, hydroxy, thiol, $C_{1-6}$ alkylthio or amino.

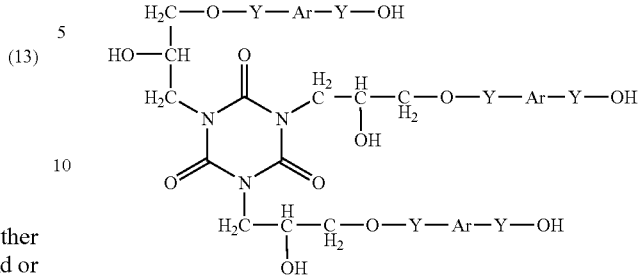

(25)

The compounds of formula (14) to be reacted with the triazine trione compound having the substituent of formula (13) on nitrogen atom include the compounds of formulae (16) to (21):

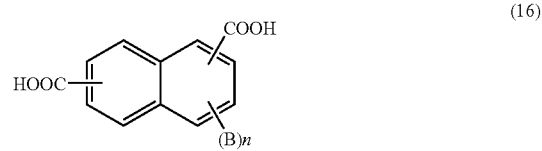

(16)

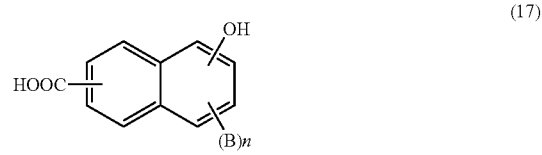

(17)

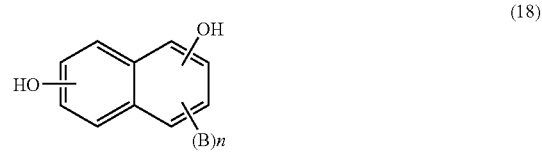

(18)

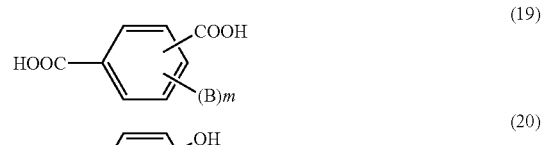

(19)

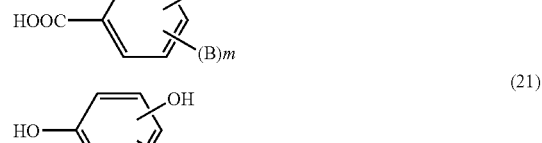

(20)

(21)

wherein B is hydrogen atom, $C_{1-6}$ alkyl, phenyl, naphthyl, halogen atom, $C_{1-6}$ alkoxycarbonyl, nitro, carboxy, cyano, $C_{1-6}$ alkoxy, hydroxy, thiol, $C_{1-6}$ alkylthio or amino, n is a number of 1 to 6, m is a number of 1 to 4, and B may be identical with or different from each other in case where n or m is 2 or more. In this reaction, the compounds of formulae (16) to (21) can be used in only one or in a combination of two or more.

As the triazine trione compound having the substituent of formula (3) on nitrogen atom, the compounds having the structure of formula (7) can be used. In formula (7), $A_1$, $A_2$ and $A_3$ are independently of one another hydrogen atom, methyl or ethyl, $R_1$ is $C_{1-6}$ alkyl, phenyl or benzyl, $R_2$ is hydrogen atom or $C_{1-6}$ alkyl. $C_{1-6}$ alkyl includes for example methyl, ethyl, n-pentyl, i-propyl, cyclohexyl or the like.

The compound of formula (7) can be produced by reacting the triazine trione compound having the substituent of formula (13) on nitrogen atom with carbon dioxide to convert epoxy ring moiety into dioxolanone ring, and then reacting with an amine compound of formula (26).

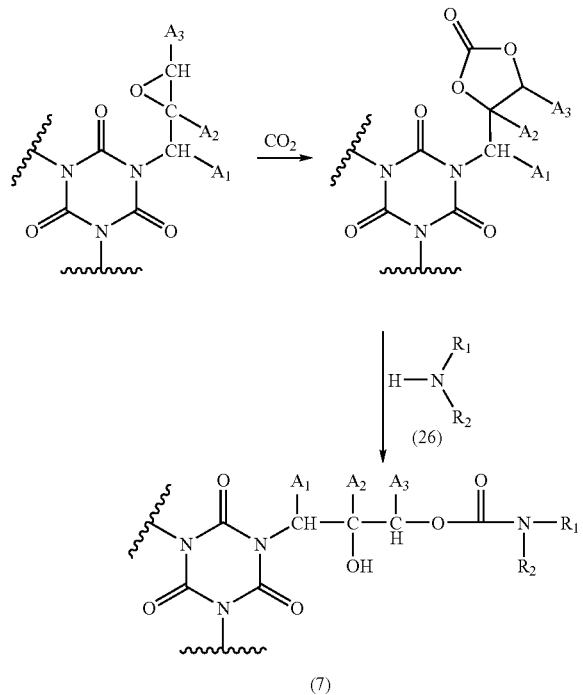

The reaction for converting epoxy ring moiety into dioxolanone ring can be carried out by reacting with carbon dioxide for example in the presence of lithium bromide. And, the reaction of dioxolanone ring with the amine compound of formula (26) can be carried out for example in N,N-dimethylformamide at 70° C. for 48 hours.

When the triazine trione compound having two or three nitrogen atoms having the substituent of formula (13) is used in this reaction, it is assumed that all epoxy ring moieties of them are converted into dioxolanone rings and then converted into the substituents of formula (3) or only one or two epoxy ring moieties are converted into the substituents of formula (3). The present invention include both cases.

As the triazine trione compound having the substituent of formula (13) on nitrogen atom, the compound having three substituents of formula (13), the compound of formula (15) is preferably used. In the composition for forming anti-reflective coating according to the present invention, the compound produced by converting all epoxy ring moieties of the compound of formula (15) into the substituents of formula (3) is preferably used, and the compound of formula (27) is preferably used.

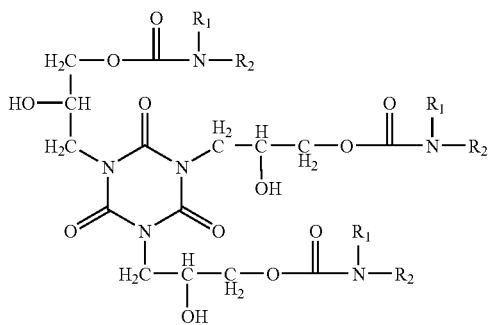

wherein $R_1$ and $R_2$ have the same meaning above.

The compounds of formula (26) to be reacted with the triazine trione compound having the substituent of formula (13) on nitrogen atom include for example methylamine, ethylamine, isopropylamine, n-butylamine, cyclohexylamine, aniline, benzylamine, dimethylamine, diethylamine, diisopropylamine, dibenzylamine or diphenylamine. In this reaction, the compound of formula (26) can be used in only one or in a combination of two or more.

In the composition for forming anti-reflective coating according to the present invention, the compound of formula (27) may be used alone or in a combination of two or more. The content of the compound of formula (27) is 10 mass % or more, for example 30 mass % to 99 mass %, for example 50 mass % to 99 mass %, further for example 60 to 95 mass % in the total solid content.

In the composition for forming anti-reflective coating containing the compound of formula (27) according to the present invention, the characteristics of the anti-reflective coating formed from the composition for forming anti-reflective coating, particularly light absorption characteristics, attenuation coefficient, refractive index and the like to irradiation light used for lithography process depend on the kind of the compound of formula (26) used in the reaction.

In the composition for forming anti-reflective coating according to the present invention, as the triazine trione oligomer compound or triazine trione polymer compound having a structure in which at least two triazine trione rings are linked through a linking group of formula (4) on the nitrogen atoms, the triazine trione oligomer compound or triazine trione polymer compound having the structure of formula (8) can be used. In formula (8), $A_1$, $A_2$ and $A_3$ are independently of one another hydrogen atom, methyl or ethyl, Y is a direct bond or —C(=O)—, Ar is benzene ring or naphthalene ring which may be substituted with $C_{1-6}$ alkyl, phenyl, naphthyl, halogen atom, $C_{1-6}$ alkoxycarbonyl, nitro, carboxy, cyano, $C_{1-6}$ alkoxy, hydroxy, thiol, $C_{1-6}$ alkylthio or amino.

The weight average molecular weight of the triazine trione oligomer compound or triazine trione polymer compound having the structure of formula (8) in the composition for forming anti-reflective coating according to the present invention is not specifically limited and is for example 700 to 200000, and for example 1000 to 50000.

The triazine trione oligomer compound or triazine trione polymer compound having the structure of formula (8) can be obtained by reacting the compounds having two or three nitrogen atoms having the substituent of formula (13) on nitrogen atom with the aromatic compound of formula (14). In this reaction, the compound of formula (14) can be used in only alone or in a combination of two or more.

This reaction is preferably carried out in a solution state in which they are dissolved in an organic solvent such as benzene, toluene, xylene, ethyl lactate, butyl lactate, propylene glycol monomethyl ether, propylene glycol monomethyl ether acetate, N-methyl pyrrolidone or the like. In addition, in the reaction, quaternary ammonium salt such as benzyl triethyl ammonium chloride, tetrabutyl ammonium chloride, tetraethyl ammonium bromide or the like can be used as a catalyst for the reaction. The reaction temperature and reaction time depend on the compounds to be used or the concentration thereof or the like, but the reaction time is suitably selected from 0.1 to 100 hours, and the reaction temperature is suitably selected from 20° C. to 200° C. When the catalyst is used, it may be used in an amount of 0.001 to 50 mass % based on the total mass of used compounds.

In this reaction, the triazine trione compound having two or three substituents of formula (13) on nitrogen atom can be used alone or in a combination of two or more. The compounds having three substituents of formula (13), that is, the compound of formula (15) is preferably used.

In this reaction, it is assumed that all substituents of the triazine trione compound having two or three nitrogen atoms having the substituent of formula (13) are reacted with the compound of formula (14) to form liking groups of formula (4) or only one or two substituents of formula (13) are involved in the formation of the linking group of formula (4) and the remaining substituent of formula (13) is unreacted or, involved in the formation of the substituent of formula (2). In the triazine trione oligomer compound or the triazine trione polymer compound, it is assumed that one or two substituents of formula (13) in the triazine compound being a raw material are involved in the formation of the linking group of formula (4), that is, the formation of oligomer structure, polymer structure, and the remaining substituent of formula (13) is unreacted or involved in the formation of the substituent of formula (2), or that all (that is, two or three) substituents of formula (13) are involved in the formation of the linking group of formula (4), that is, the formation of oligomer structure, polymer structure.

In the production of the triazine trione oligomer compound or triazine trione polymer compound according to this reaction, the compound of formula (15) being the compound having three substituents of formula (13) is preferably used, particularly the compound of formula (28) is preferably used.

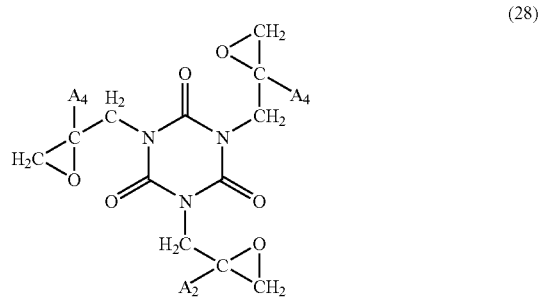

(28)

wherein $A_4$ is hydrogen atom or methyl.

The compound of formula (14) used for the preparation of the triazine trione oligomer compound or triazine trione polymer compound having the structure of formula (8) includes compounds having naphthalene ring or benzene ring of formulae (16) to (21). These compounds can be used alone or in a combination of two or more.

The composition for forming anti-reflective coating according to the present invention contains the triazine trione compound, triazine trione oligomer compound or triazine trione polymer compound obtained by the reaction between the triazine trione compound having the substituent of formula (13) on nitrogen atom and the phenyl compound or naphthyl compound of formula (14). The composition for forming anti-reflective coating according to the present invention contains any compositions containing such a triazine trione compound, triazine trione oligomer compound or triazine trione polymer compound only, or containing a mixture of the triazine trione compound and the triazine trione oligomer compound, a mixture of the triazine trione compound and the triazine trione polymer compound, a mixture of the triazine trione oligomer compound and the triazine trione polymer compound, or a mixture of the triazine trione compound, the triazine trione oligomer compound and the triazine trione polymer compound.

In the composition for forming anti-reflective coating containing the triazine trione compound, triazine trione oligomer compound or triazine trione polymer compound produced by reaction between the triazine trione compound having the substituent of formula (13) on nitrogen atom and the compound of formula (14), according to the present invention, the characteristics of the anti-reflective coating formed from the composition for forming anti-reflective coating, particularly light absorption characteristics, attenuation coefficient, refractive index and the like to irradiation light used for lithography process largely depend on the kind of the compound of formula (14) used in the reaction. In addition, the kind of the compound of formula (14) used affects the time required for the removal step of the anti-reflective coating formed from the composition for forming anti-reflective coating according to the present invention by etching. In particular, the kind and number of substituents on benzene ring or naphthalene ring on the compound of formula (14) affect the time required for the removal step of anti-reflective coating by etching. The introduction of substituent containing halogen atom, nitrogen atom, oxygen atom, sulfur atom or the like, or the increase in the number thereof can make possible to reduce time required for the removal step by etching.

In case where the composition for forming anti-reflective coating according to the present invention is applied for a process with a light of wavelength 248 nm (KrF excimer laser), the compound of formula (14) having naphthalene ring of formulae (16) to (18) is preferably used. In addition, in case where it is applied for a process with a light of wavelength 193 nm (ArF excimer laser) or wavelength 157 nm (F2 excimer laser), the compound having benzene ring of formulae (19) to (21) is preferably used.

Such naphthalene ring-containing compounds include for example 3-hydroxynaphthalene-2-carboxylic acid, naphthalene-2,6-dicarboxylic acid, naphthalene-2,3-dicarboxylic acid, 1,6-dibromo-2-hydroxynaphthalene-3-carboxylic acid, 6-hydroxynaphthalene-2-carboxylic acid, 3,7-dihydroxynaphthalene-2-carboxylic acid, 4-hydroxy-1-phenyl-naphthalene-2-carboxylic acid, 6-hydroxynaphthalene-2-carboxylic acid, 4-bromonaphthalene-1,8-dicarboxylic acid, 2-hydroxynaphthalene-1-carboxylic acid, 4-bromonaphthalene-1,4-dicarboxylic acid, 1,5-dihydroxynaphthalene, 2,6-dibromo-1,5-dihydroxynaphthalene, 1,7-dihydroxynaphthalene, 6-ethoxy-2,3-dihydroxynaphthalene or the like.

Such benzene ring-containing compounds include for example 3-hydroxybenzoic acid, 3,5-dihydroxybenzoic acid, 2-amino-3-hydroxybenzoic acid, 2,5-dichloro-3-hydroxy-6-methoxybenzoic acid, 2,4,6-triiodo-3-hydroxybenzoic acid, 2,4,6-tribromo-3-hydroxybenzoic acid, 2-bromo-4,6-dimethyl-3-hydroxybenzoic acid, 2-fluoro-5-hydroxybenzoic acid, 3-methoxy-4-hydroxybenzoic acid, 3,5-dibromo-4-hydroxybenzoic acid, 2,4-dihydroxy-5-bromobenzoic acid, 3-iodo-5-nitro-4-hydroxybenzoic acid, 2-hydroxybenzoic acid, 4-chloro-2-hydroxybenzoic acid, 3,5-diiodo-2-hydroxybenzoic acid, 3-methoxy-2-hydroxybenzoic acid, 2-hydroxy-6-isopropyl-3-methylbenzoic acid, 4-amino-3,5-diiodo-2-hydroxybenzoic acid, 4,5-dichloro-benzene-1,3-dicarboxylic acid, 5-amino-2,4,6-triiodoisophthalic acid, benzene-1,4-dicarboxylic acid, 2,3,5,6-tetrabromo-benzene-1,4-dicarboxylic acid, 4,5-dichlorophthalic acid, 5-methoxy-3-methylphthalic acid, 3,4,5,6-tetrabromophathalic acid or the like.

In the composition for forming anti-reflective coating according to the present invention, as the triazine trione oligomer compound or triazine trione polymer compound having a structure in which at least two triazine trione rings are linked through a linking group of formula (5) on the nitrogen atoms, the triazine trione oligomer compound or triazine trione polymer compound having the structure of formula (9)

can be used. In formula (9), $A_1$, $A_2$ and $A_3$ are independently of one another hydrogen atom, methyl or ethyl, Q is $C_{1-6}$ alkyl or $C_{5-8}$ cycloalkyl, Ar or —$CH_2$—Ar—$CH_2$—, $R_1$ is $C_{1-6}$ alkyl, phenyl or benzyl, $R_2$ is hydrogen atom, $C_{1-6}$ alkyl, phenyl or benzyl.

The weight average molecular weight of the triazine trione oligomer compound or triazine trione polymer compound of formula (9) in the composition for forming anti-reflective coating according to the present invention is not specifically limited and is for example 700 to 200000, and for example 1000 to 50000.

The triazine trione oligomer compound or triazine trione polymer compound having the structure of formula (9) can be obtained by reacting the triazine trione compound having the substituent of formula (13) on nitrogen atom with carbon dioxide to convert epoxy ring moiety into dioxolanone ring, and then reacting with an amine compound of formula (29).

the triazine trione polymer compound, it is assumed that one or two substituents of formula (13) in the triazine compound being a raw material are involved in the formation of the linking group of formula (5), that is, the formation of oligomer structure, polymer structure, and the remaining substituent of formula (13) is unreacted or involved in the formation of the substituent of formula (3), or that all (that is, two or three) substituents of formula (13) are involved in the formation of the linking group of formula (5), that is, the formation of oligomer structure, polymer structure.

In the production of the triazine trione oligomer compound or triazine trione polymer compound according to this reaction, the compound of formula (15) being the compound having three substituents of formula (13) is preferably used, particularly the compound of formula (28) is preferably used.

The compounds of formula (29) used for producing the triazine trione oligomer compound or triazine trione polymer

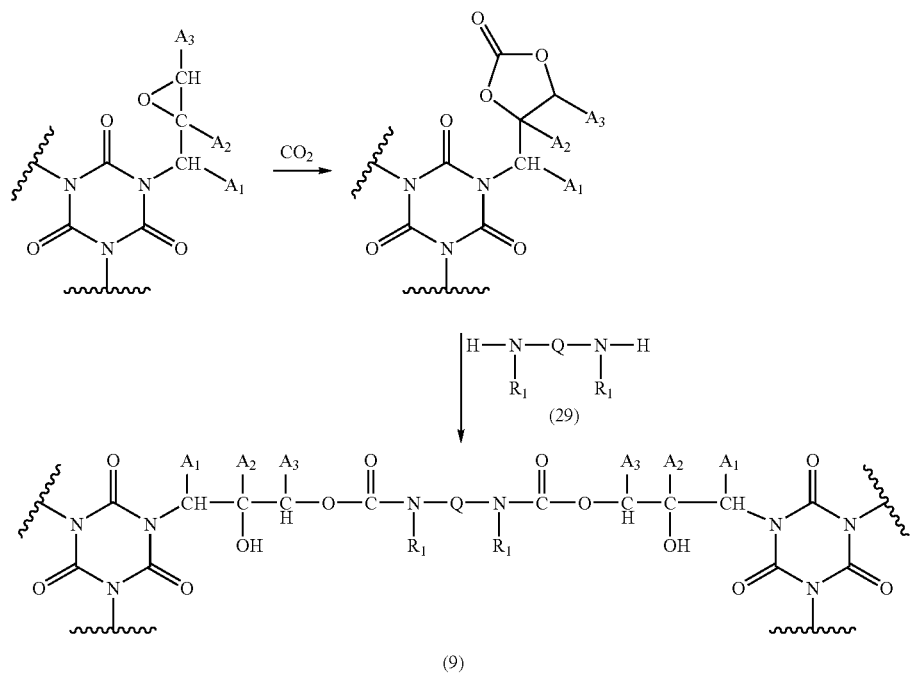

(9)

The reaction of dioxolanone ring with the amine compound of formula (29) can be carried out for example in the presence of N,N-dimethylformamide solvent at 70° C. for 48 hours. In this reaction, the compound of formula (29) can bemused alone or in a combination of two or more.

In this reaction, the triazine trione compound having two or three nitrogen atoms having the substituent of formula (13) can be used alone or in a combination of two or more. The compound having three substituents of formula (13), that is, the compound of formula (15) is preferably used.

In this reaction, it is assumed that all epoxy ring moieties of the triazine trione compound having two or three nitrogen atoms having the substituent of formula (13) are converted into dioxolanone ring, and then reacted with the compound of formula (29) to form liking groups of formula (5) or only one or two epoxy ring moieties of formula (13) are involved in the formation of the linking group of formula (5) and the remaining substituent of formula (13) is unreacted or involved in the formation of the substituent of formula (3) wherein $R_2$ is hydrogen atom. In the triazine trione oligomer compound or compound having the structure of formula (9) include for example ethylenediamine, propylenediamine, phenylenediamine, 2-hydroxy-1,3-propylenediamine, 1,4-cyclohexyldiamine, xylenediamine, 2,6-dichlorophenylenediamine, 1,4-diaminonaphthalene, 1,5-diaminonaphthalene or the like. These compounds can be used alone or in a combination of two or more.

In the composition for forming anti-reflective coating containing the triazine trione compound, triazine trione oligomer compound or triazine trione polymer compound having the structure of formula (9) according to the present invention, the characteristics of the anti-reflective coating formed from the composition for forming anti-reflective coating, particularly light absorption characteristics, attenuation coefficient, refractive index and the like to irradiation light used for lithography process largely depend on the kind of the compound of formula (29) used in the reaction. In addition, the kind of the compound of formula (29) used affects the time required for the removal step of the anti-reflective coating formed from the composition for forming anti-reflective coating according to the present invention by etching.

In case where the composition for forming anti-reflective coating according to the present invention is applied for a process with a light of wavelength 248 nm (KrF excimer laser), compounds preferably used as the compound of formula (29) are compounds having a naphthalene ring, such as 1,4-diaminonaphthalene, 1,5-diaminonaphthalene, 2,3-diaminonaphthalene or the like. In addition, in case where it is applied for a process with a light of wavelength 193 nm (ArF excimer laser) or wavelength 157 nm (F2 excimer laser), compound having benzene ring, such as phenylenediamine, xylenediamine, 2,6-dichlorophenylenediamine, 3,5-dibromo-1,2-phenylenediamine, 3,4,5,6-tetraiodo-1,2-phenylenediamine or the like are preferably used.

The substituent of formula (2) or (3) and the linking group of formula (4) or (5) in the triazine trione compound having the substituent of formula (2) or (3) as substituent on nitrogen atom, or the triazine trione oligomer compound or triazine trione polymer compound having a structure in which at least two triazine trione rings are linked through a linking group of formula (4) or (5) on the nitrogen atoms, contained in the composition for forming anti-reflective coating according to the present invention include the followings.

For example, the substituent of formula (2) includes the substituents of formulae (30) to (37):

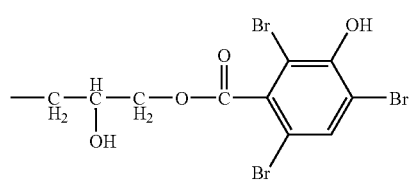
(30)

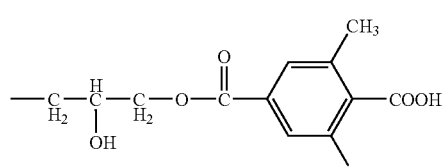
(31)

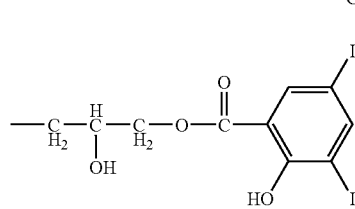
(32)

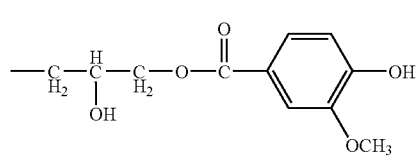
(33)

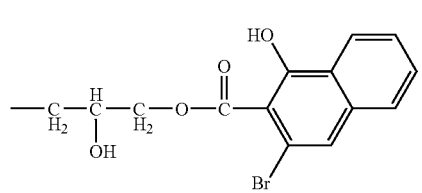
(34)

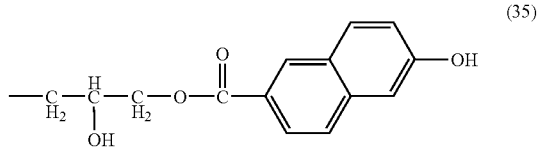
(35)

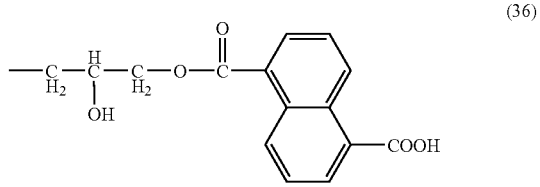
(36)

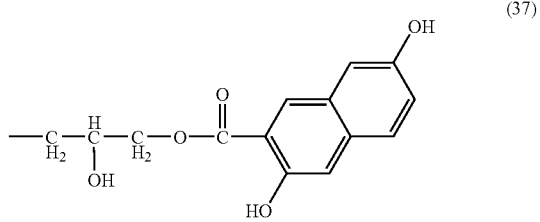
(37)

For example, the substituent of formula (3) includes the substituents of formulae (38) to (43):

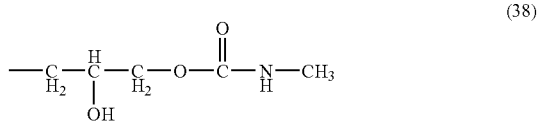
(38)

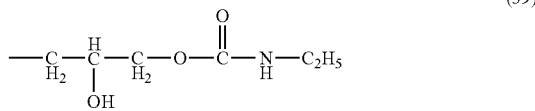
(39)

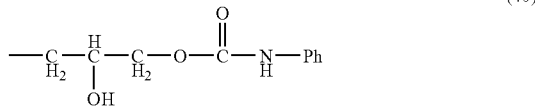
(40)

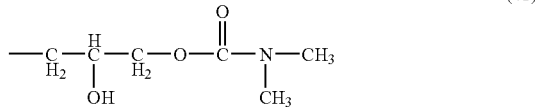
(41)

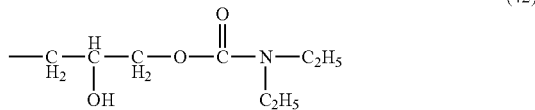
(42)

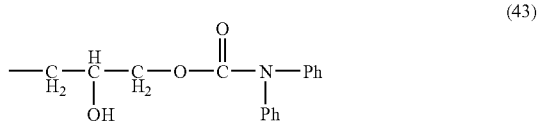
(43)

Further, the linking group of formula (4) includes for example the substituents of formulae (44) to (52):

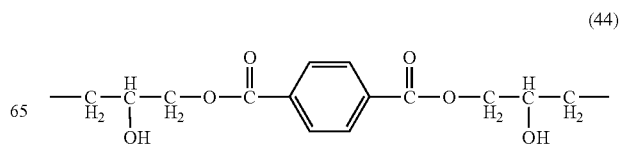
(44)

-continued

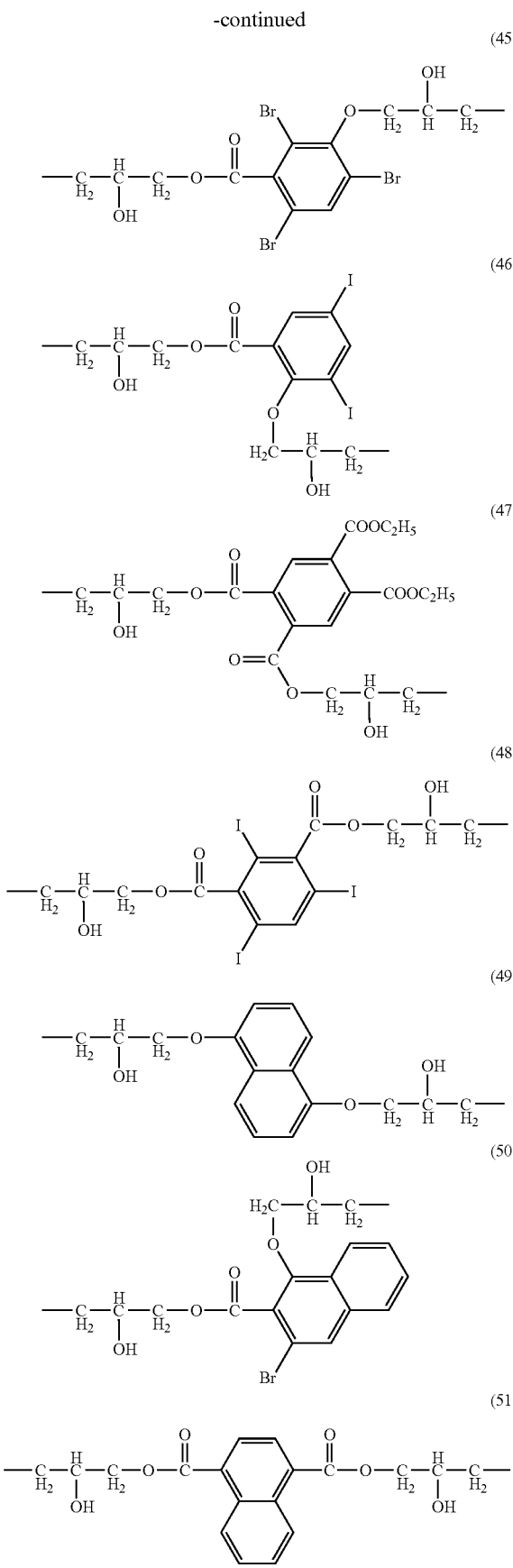

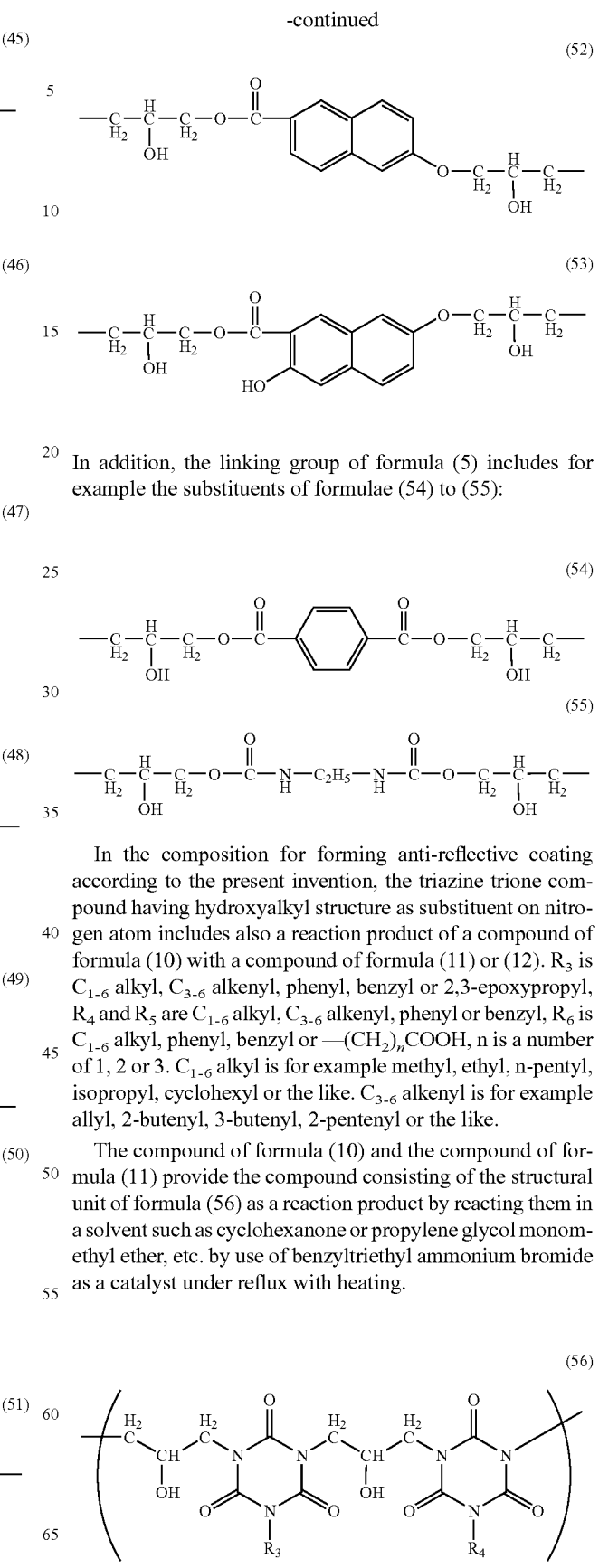

In addition, the linking group of formula (5) includes for example the substituents of formulae (54) to (55):

In the composition for forming anti-reflective coating according to the present invention, the triazine trione compound having hydroxyalkyl structure as substituent on nitrogen atom includes also a reaction product of a compound of formula (10) with a compound of formula (11) or (12). $R_3$ is $C_{1-6}$ alkyl, $C_{3-6}$ alkenyl, phenyl, benzyl or 2,3-epoxypropyl, $R_4$ and $R_5$ are $C_{1-6}$ alkyl, $C_{3-6}$ alkenyl, phenyl or benzyl, $R_6$ is $C_{1-6}$ alkyl, phenyl, benzyl or —$(CH_2)_n$COOH, n is a number of 1, 2 or 3. $C_{1-6}$ alkyl is for example methyl, ethyl, n-pentyl, isopropyl, cyclohexyl or the like. $C_{3-6}$ alkenyl is for example allyl, 2-butenyl, 3-butenyl, 2-pentenyl or the like.

The compound of formula (10) and the compound of formula (11) provide the compound consisting of the structural unit of formula (56) as a reaction product by reacting them in a solvent such as cyclohexanone or propylene glycol monomethyl ether, etc. by use of benzyltriethyl ammonium bromide as a catalyst under reflux with heating.

In case where R₃ is 2,3-epoxypropyl in formula (10), all of three epoxy ring moieties can be reacted with the compound of formula (11), and can provide the compound having the structural unit of formula (57).

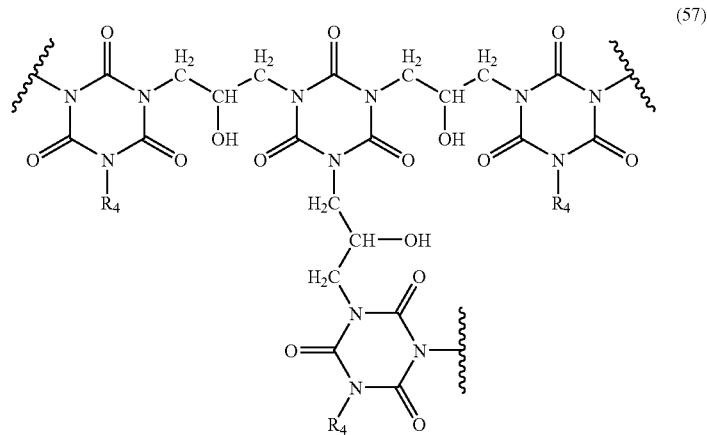
(57)

The number of the structural unit of formulae (56) and (57) contained in the reaction product varies depending on the reaction condition. The reaction product used in the composition for forming anti-reflective coating according to the present invention contains the structural unit of formula (56) of 1 to 10000, and oligomer compounds or polymer compounds of weight average molecular weight of 400 to 1000000 are preferably used. In addition, oligomer compounds or polymer compounds containing the structural unit of formula (57) of 1 to 10000 and having a weight average molecular weight of 400 to 1000000 are preferably used.

The compound of formula (10) and the compound of formula (12) provide a reaction product by reacting them in a solvent such as cyclohexanone or propylene glycol monomethyl ether, etc. by use of benzyltriethyl ammonium bromide as a catalyst under reflux with heating. In case where $R_6$ is $C_{1-6}$ alkyl, phenyl or benzyl in formula (12), a reaction product is provided by the reaction between one carboxy of formula (12) and the epoxy ring of formula (10). In case where $R_6$ is —$(CH_2)_n$COOH in formula (12), the reaction product consisting of the structural unit of formula (58) is provided by the reaction between two carboxy groups thereof and respective epoxy ring of formula (10).

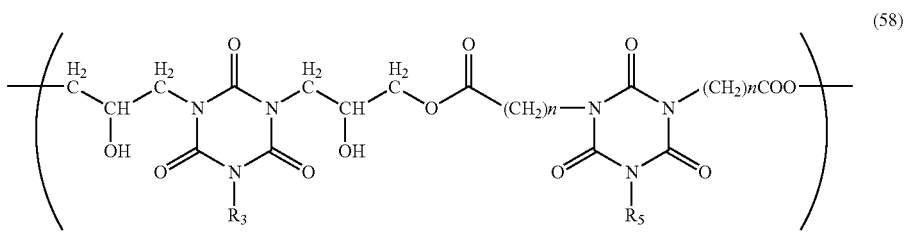
(58)

In case where R₃ is 2,3-epoxypropyl in formula (10), all of three epoxy ring moieties can be reacted with the carboxy groups of formula (12), and can provide the compound having the structural unit of formula (59).

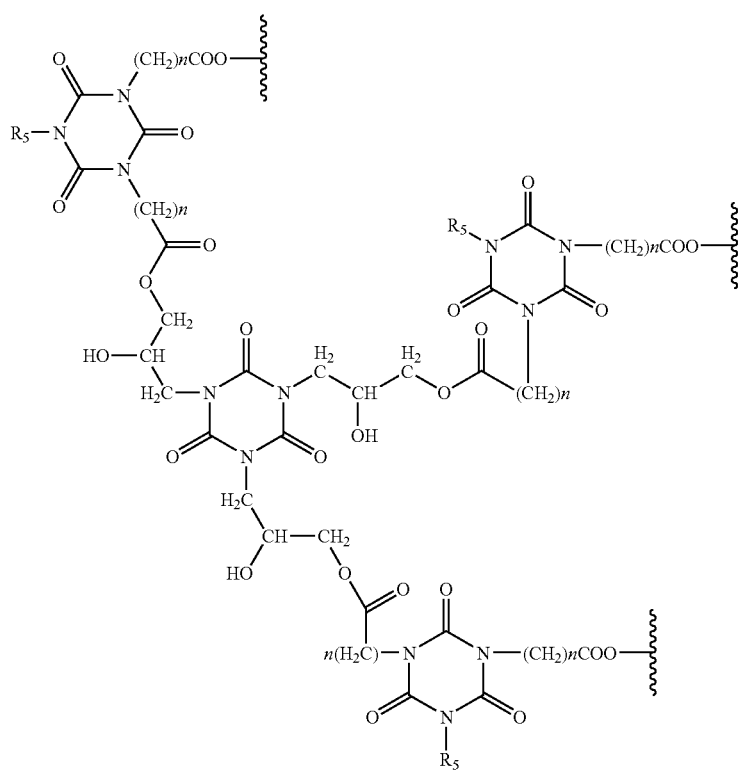

(59)

The number of the structural unit of formulae (58) and (59) contained in the reaction product varies depending on the reaction condition. The reaction product used in the composition for forming anti-reflective coating according to the present invention contains the structural unit of formula (58) of 1 to 10000, and oligomer compounds or polymer compounds of weight average molecular weight of 400 to 1000000 are preferably used. In addition, oligomer compounds or polymer compounds containing the structural unit of formula (59) of 1 to 10000 and having a weight average molecular weight of 400 to 1000000 are preferably used.

In the composition for forming anti-reflective coating according to the present invention, the reaction product containing the structural unit of formulae (56) can be used in a combination with the reaction product containing the structural unit of formulae (58).

The compound of formula (10) used for the production of the reaction product includes for example monoallyldiglycidyl isocyanuric acid, monomethyldiglycidyl isocyanuric acid, monoethyldiglycidyl isocyanuric acid, monobutyldiglycidyl isocyanuric acid, monophenyldiglycidyl isocyanuric acid, monobenzyldiglycidyl isocyanuric acid.

The compound of formula (11) includes for example monoallyl isocyanuric acid, monomethyl isocyanuric acid, monoethyl isocyanuric acid, monobutyl isocyanuric acid, monophenyl isocyanuric acid, monobenzyl isocyanuric acid.

And, the compound of formula (12) includes for example dimethyl monocarboxyethyl isocyanuric acid, diethyl monocarboxyethyl isocyanuric acid, diallylcarboxyethyl isocyanuric acid, dibutyl monocarboxyethyl isocyanuric acid, diphenyl monocarboxyethyl isocyanuric acid, dibenzyl monocarboxyethyl isocyanuric acid.

The anti-reflective coating forming composition according to the present invention is preferably crosslinked after application by heating in order to prevent intermixing with a photoresist applied thereon. In addition, the anti-reflective coating forming composition according to the present invention may further contain a crosslinking agent component. The crosslinking agent includes melamines and substituted ureas having crosslink-forming substituents such as methylol or methoxymethyl groups, or polymer compounds having epoxy groups, and the like. Preferable crosslinking agents are ones having at least two crosslink-forming substituents, for example, compounds such as methoxymethylated glycoluril, methoxymethylated melamine, more preferably tetramethoxymethyl glycoluril or hexamethoxymethyl melamine. Further, the crosslinking agents include compounds such as tetramethoxymethyl urea or tetrabutoxymethyl urea. The addition amount of the crosslinking agent may vary depending on the coating solvents used, the underlying substrate used, the viscosity of the solution required, the shape of the coating required, etc., and usually 0.001 to 20 mass %, preferably 0.01 to 15 mass %, more preferably 0.05 to 10 mass % in the total composition. These crosslinking agents occasionally occur a crosslinking reaction due to self-condensation, but they can be cross-reacted with a crosslink-forming substituent on the triazine trione compound having hydroxyalkyl structure as substituent on nitrogen atom, triazine trione oligomer compound having hydroxyalkyl structure as substituent on nitrogen atom, or triazine trione polymer compound having hydroxyalkyl structure as substituent on nitrogen atom contained in anti-reflective coating forming composition according to the present invention, for example hydroxy in formula (1), (2), (3), (4), (5), (56), (57), (58) or (59).

As catalyst for promoting the above-mentioned crosslinking reaction in the present invention, acid compounds, such as p-toluenesulfonic acid, trifluoromethanesulfonic acid, pyridinium p-toluenesulfonate, salicylic acid, sulfosalicylic acid, citric acid, benzoic acid, hydroxybenzoic acid, etc. and/or thermal acid generators, such as 2,4,4,6-tetrabromocyclohexadienone, benzointosylate, 2-nitrobenzyltosylate, etc. may be added. The blending amount thereof is 0.02 to 10 mass %, for example 0.04 to 5 mass % in the total solid content.

The composition for forming anti-reflective coating according to the present invention can further contain a resin having at lease one crosslink-forming substituent selected from hydroxy group, carboxy group, amino group and thiol group. The addition of such a resin enables the adjustment of characteristics such as refractive index, attenuation coefficient, etching rate or the like of the anti-reflective coating formed from the composition for forming anti-reflective coating according to the present invention. The resin can include one containing as a structural unit 2-hydroxyethylacrylate, 2-hydroxypropylacrylate, 2-hydroxyethylmethacrylate, 2-hydroxypropylmethacrylate, vinyl alcohol, 2-hydroxyethyl vinyl ether, acrylic acid, methacrylic acid or the like. The resin has a weight average molecular weight of preferably 500 to 1,000,000, more preferably 500 to 500,000 or 1,000 to 100,000. The amount of the resin in the composition for forming anti-reflective coating is 20 mass % or less, preferably 15 mass % or less in the total solid content.

The resin includes for example poly 2-hydroxyethyl methacrylate, polyvinyl alcohol, polyacrylic acid, a copolymer of 2-hydroxypropyl acrylate with methyl methacrylate, a copolymer of 2-hydroxypropyl acrylate with isopropyl methacrylate, a copolymer of 2-hydroxypropyl methacrylate with 2,2,2-trichloroethyl methacrylate, a copolymer of 2-hydroxypropyl methacrylate with 2,2,2-trifluoroethyl methacrylate, a copolymer of 2-hydroxypropyl methacrylate with 2-chloroethyl methacrylate, a copolymer of 2-hydroxypropyl methacrylate with cyclohexyl methacrylate, a copolymer of 2-hydroxypropyl methacrylate with n-octyl methacrylate, a copolymer of 2-hydroxypropyl methacrylate with vinyl alcohol, a copolymer of 2-hydroxypropyl methacrylate with acrylic acid, a copolymer of 2-hydroxypropyl methacrylate with maleimide, a copolymer of 2-hydroxypropyl methacrylate with acrylonitrile, a copolymer of vinyl alcohol with methyl methacrylate, a copolymer of vinyl alcohol with maleimide, a copolymer of vinyl alcohol with methyl methacrylate, a copolymer of 2-hydroxyethyl vinyl ether with ethyl methacrylate, a copolymer of 2-hydroxyethyl vinyl ether with 2-hydroxypropyl methacrylate, a copolymer of methacrylic acid with ethyl methacrylate, a copolymer of methacrylic acid with maleimide, or the like.

The anti-reflective coating composition according to the present invention may contain photoacid generators in order to adjust the acidity to that of a photoresist applied thereon in the lithography process. Preferable photoacid generators include for example onium salt photoacid generators, such as bis(4-t-butylpheny)iodonium trifluoromethanesulfonate or triphenylsulfonium trifluoromethanesulfonate, halogen-containing photoacid generators, such as phenyl-bis(trichloromethyl)-s-triazine, sulfonate photoacid generators, such as benzoin tosylate or N-hydroxysuccinimide trifluoromethanesulfonate. The photoacid generators are added in an amount of 0.2 to 3 mass %, preferably 0.4 to 2 mass %. in the total solid content.

Light absorbing compounds or light absorbing resins can be added to the composition for forming anti-reflective coating according to the present invention. The addition of the light absorbing compounds or light absorbing resins enables the adjustment of characteristics such as refractive index, attenuation coefficient, etching rate or the like of the anti-reflective coating formed from the composition for forming anti-reflective coating according to the present invention. These light absorbing compounds or light absorbing resins include ones having a high absorptivity to a light in photosensitive characteristics wavelength region of the photosensitive component in the photoresist layer formed on the anti-reflective coating and preventing standing wave due to reflection from the substrate or random reflection due to unevenness on the surface of substrate. Further, the light absorbing resin used has a weight average molecular weight of 500 to 1,000,000, preferably 500 to 500,000, or 1,000 to 10,000.

The light absorbing compound or light absorbing resin can be used alone or in a mixture of two or more. The amount of the light absorbing compound or light absorbing resin in the composition for forming anti-reflective coating according to the present invention is preferably 0.01 mass % or more, 1 to 90 mass %, for example 1 to 50 mass %, or for example 5 to 40 mass % in the total solid content.

As the light absorbing compound, for example the following compounds are preferably used: phenyl compounds, benzophenone compounds, benzotriazole compounds, azo compounds, naphthalene compounds, anthracene compounds, anthraquinone compounds, triazine compounds, triazine trione compounds, quinoline compounds or the like. Phenyl compounds, naphthalene compounds, anthracene compounds, triazine compounds and triazine trione compounds are preferably used.

Phenyl compounds having at least one hydroxy group, amino group or carboxy group, naphthalene compounds having at least one hydroxy group, amino group or carboxy group, and anthracene compounds having at least one hydroxy group, amino group or carboxy group are preferably used.

The phenyl compounds having at least one hydroxy group, amino group or carboxy group include phenol, bromophenol, 4,4'-sulfonyldiphenol, tert-butylphenol, biphenol, benzoic acid, salicylic acid, hydroxyisophthalic acid, phenylacetic acid, aniline, benzylamine, benzylalcohol, cinnamyl alcohol, phenylalanine, phenoxypropanol or the like.

The naphthalene compounds having at least one hydroxy group, amino group or carboxy group includes 1-naphthalene carboxylic acid, 2-naphthalene carboxylic acid, 1-naphthol, 2-naphthol, 1-aminonaphthalene, naphthyl acetic acid, 1-hydroxy-2-naphthalene carboxylic acid, 3-hydroxy-2-naphthalene carboxylic acid, 3,7-dihydroxy-2-naphthalene carboxylic acid, 6-bromo-2-hydroxynaphthalene, 2,6-naphthalene dicarboxylic acid or the like.

The anthracene compounds having at least one hydroxy group, amino group or carboxy group in the molecule includes 9-anthracene carboxylic acid, 9-hydroxymethylanthracene, 1-aminoanthracene or the like.

As the light absorbing compound, for example resins having the aromatic ring structure such as benzene ring, naphthalene ring or anthracene ring in the structure, or having the hetero-aromatic ring structure such as pyridine ring, quinoline ring, thiophene ring, thiazole ring, triazine ring or oxazole ring can be used.

As the light absorbing compound, resins having at least one aromatic ring structure such as benzene ring, naphthalene ring or anthracene ring in the repeating structural unit can be used.

The resins having benzene ring include novolak resin, halogenated novolak resin, polystyrene, polyhydroxystyrene or the like. In addition, resins containing benzylacrylate, benzylmethacrylate, styrene, hydroxystyrene or the like as structural unit may be mentioned. Such resins include copolymer of benzylmethacrylate with 2-hydroxypropylmethacrylate, copolymer of styrene with 2-hydroxyethylmethacrylate, copolymer of hydroxystyrene with ethylmethacrylate, terpolymer of benzylmethacrylate, 2-hydroxypropylmethacrylate and ethylmethacrylate, terpolymer of styrene, 2-hydroxyethylmethacrylate and methylmethacrylate or the like.

Further, the resin having benzene ring includes the resin produced from melamine compound (trade name: Cymel 303) and benzoguanamine compound (trade name: Cymel 1123), which is described in U.S. Pat. No. 6,323,310.

The resins having naphthalene ring or anthracene ring include for example the resins the following structural units ((a)-(g)):

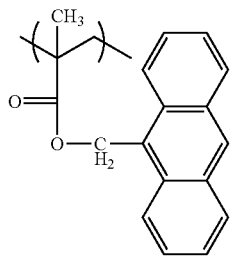
(a)

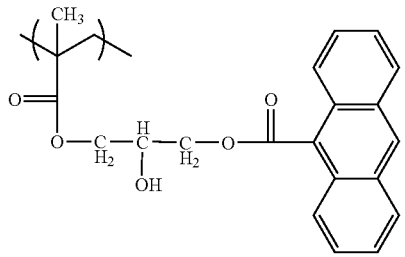
(b)

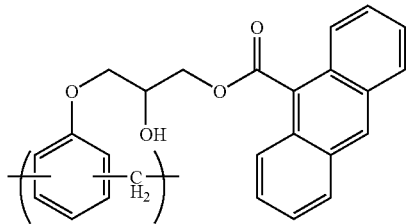
(c)

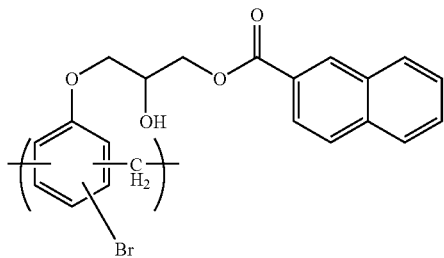
(d)

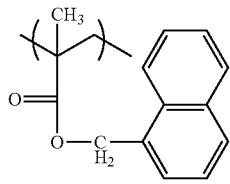
(e)

-continued

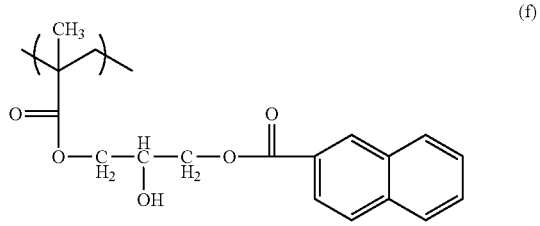
(f)

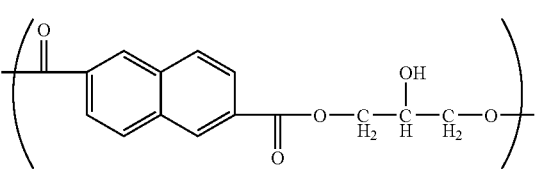
(g)

The anti-reflective coating forming composition according to the present invention may contain further rheology controlling agents, adhesion auxiliaries, surfactants, etc. in addition to the above described ones, if necessary.

The rheology controlling agents are added mainly aiming at increasing the flowability of the anti-reflective coating forming composition and in particular in the baking step, increasing filling property of the anti-reflective coating forming composition into the inside of holes. Specific examples thereof include phthalic acid derivatives such as dimethyl phthalate, diethyl phthalate, diisobutyl phthalate, dihexyl phthalate or butyl isodecyl phthalate; adipic acid derivatives such as di-n-butyl adipate, diisobutyl adipate, diisooctyl adipate or octyldecyl adipate; maleic acid derivatives such as di-n-butyl maleate, diethyl maleate or dinonyl maleate; oleic acid derivatives such as methyl oleate, butyl oleate or tetrahydrofurfuryl oleate; or stearic acid derivatives such as n-butyl stearate or glyceryl stearate. The rheology controlling agents are blended in proportions of usually less than 30 mass % in the total composition of anti-reflective coating for lithography.

The adhesion auxiliaries are added mainly for the purpose of increasing the adhesion between the substrate or photoresist and the anti-reflective coating forming composition, in particular preventing the detachment of the photoresist in development. Specific examples thereof include chlorosilanes such as trimethylchlorosilane, dimethylvinylchlorosilane, methyldiphenylchlorosilane or chloromethyldimethylchlorosilane; alkoxysilanes such as trimethylmethoxysilane, dimethyldiethoxysilane, methyldimethoxysilane, dimethylvinylethoxysilane, diphenyldimethoxysilane or phenyltriethoxysilane; silazanes such as hexamethyidisilazane, N,N'-bis(trimethylsilyl)urea, dimethyltrimethylsilylamine or trimethylsilylimidazole; silanes such as vinyltrichlorosilane, γ-chloropropyltrimethoxysilane, γ-aminopropyltriethoxysilane or γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole or mercaptopyrimidine; ureas such as 1,1-dimethylurea or 1,3-dimethylurea, or thiourea compounds. The adhesion auxiliaries are added in proportions of usually less than 5 mass %, preferably less than 2 mass %, in the total composition of the anti-reflective coating for lithography.

The anti-reflective coating forming composition according to the present invention may contain surfactants with view to preventing the occurrence of pinholes or striations and further increasing coatability not to cause surface unevenness. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., EFTOP EF301, EF303, EF352 (Tochem Products Co., Ltd.), MEGAFAC F171, F173 (Dainippon Ink and Chemicals, Inc.), FLUORAD FC430, FC431 (Sumitomo 3M Limited), ASAHI GUARD AG710, SURFLON S-382, SC101, SC102, SC103, SC104, SC105, SC106 (Asahi Glass Co., Ltd.), organosiloxane polymer KP341 (Shinetsu Chemical Co., Ltd.), etc. The blending amount of the surfactants is usually 0.2 mass % or less, preferably 0.1 mass % or less, in the total composition of-the anti-reflective coating for lithography according to the present invention. The surfactants may be added singly or two or more of them may be added in combination.

In the present invention, as the solvents for dissolving the above-described solid content such as polymer compounds, use may be made of ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, etc. The organic solvents may be used singly or in combination of two or more of them.

Further, high boiling solvents such as propylene glycol monobutyl ether or propylene glycol monobutyl ether acetate may be mixed. Among the solvents, propylene glycol monomethyl ether, propylene glycol monomethyl ether acetate, ethyl lactate, butyl lactate, and cyclohexanone are preferred for increasing the leveling property.

As photoresist to be coated as an upper layer of the anti-reflective coating in the present invention, any of negative type and positive type photoresists may be used. The photoresist includes a chemically-amplified type resist which consists of a photoacid generator and a binder having a group which is decomposed with an acid and increases alkali dissolution rate, a chemically-amplified type resist consisting of an alkali-soluble binder, a photoacid generator, and a low molecular compound which is decomposed with an acid and increases the alkali dissolution rate of the resist, a chemically-amplified resist consisting of a photoacid generator, a binder having a group which is decomposed with an acid and increases the alkali dissolution rate, and a low molecular compound which is decomposed with an acid and increases the alkali dissolution rate of the resist. For example, trade name: APEX-E manufactured by Shipley Company may be mentioned. The photoresist includes also fluorine atom-containing polymer type photoresist as described in Proc. SPIE, Vol. 3999, 330-334 (2000), Proc. SPIE, Vol. 3999, 357-364 (2000) or Proc. SPIE, Vol. 3999, 365-374 (2000).

As the developer for the above-mentioned positive type photoresist having the anti-reflective coating for lithography formed by using the anti-reflective coating forming composition of the present invention, use may be made of aqueous solutions of alkalis, e.g., inorganic alkalis such as sodium hydroxide, potassium hydroxide, sodium carbonate, sodium silicate, sodium metasilicate or aqueous ammonia, primary amines such as ethylamine or n-propylamine, secondary amines such as diethylamine or di-n-butylamine, tertiary amines such as triethylamine or methyldiethylamine, alcohol amines such as dimethylethanolamine or triethanolamine, quaternary ammonium salts such as tetramethylammonium hydroxide, tetraethylammonium hydroxide or choline, cyclic amines such as pyrrole or piperidine, etc. Furthermore, a suitable amount of alcohols such as isopropyl alcohol or surfactants such as nonionic surfactant can be added to the aqueous solution of above-described alkalis. Among these, a preferred developer includes quaternary ammonium salts, more preferably tetramethylammonium hydroxide and choline.

Now, the method forforming photoresist patterns will be described. On a substrate for use in the production of precision integrated circuit element (silicon/silicon dioxide coat substrate, silicon nitride substrate, glass substrate, ITO substrate or the like), an anti-reflective coating forming composition is coated by a suitable coating method, for example, with a spinner, a coater or the like, and thereafter the substrate is baked to cure the composition to fabricate an anti-reflective coating. The film thickness of the anti-reflective coating is for example 0.01 to 3.0 µm, or for example 0.03 to 1.0 µm. The conditions of baking after the coating are for example 80 to 250° C. for 0.5 to 120 minutes, or for example 150 to 250° C. for 0.5 to 10 minutes. Then, a photoresist is coated, it is exposed to light through a predetermined mask, developed, rinsed and dried to obtain a good photoresist pattern. If necessary, post exposure bake (PEB) may be performed. In addition, it is able to form a desired pattern on the substrate by removing by dry etching a part of the anti-reflective coating which a photoresist was removed by development in the previous step.

The anti-reflective coating produced from the composition for forming anti-reflective coating according to the present invention in which a triazine trione compound having hydroxyalkyl structure as substituent on nitrogen atom, a triazine trione oligomer compound having hydroxyalkyl structure as-substituent on nitrogen atom, or a triazine trione polymer compound having hydroxyalkyl structure as substituent on nitrogen atom is contained has a property of absorbing efficiently irradiation light with a wavelength of 248 nm, 193 nm or 157 nm. Therefore, the coating exerts an excellent effect of preventing reflection light from a substrate, and thus a photoresist pattern being an upper layer can be satisfactorily formed. In addition, the anti-reflective coating produced from the composition for forming anti-reflective coating according to the present invention in which a triazine trione compound having hydroxyalkyl structure as substituent on nitrogen atom, a triazine trione oligomer compound having hydroxyalkyl structure as substituent on nitrogen atom, or a triazine trione polymer compound having hydroxyalkyl structure as substituent on nitrogen atom is contained has a relatively high dry etching rate owing to inclusion of triazine trione ring having many hetero atoms (nitrogen atom, oxygen atom).

In the addition, light absorption characteristics, attenuation coefficient, refractive index and the like of the anti-reflective coating to irradiation light used can be controlled by the selection of M moiety contained in the compound of formula (1) or the selection of the structure of Ar moiety contained in the substitute of formula (2) or the linking group of formula (4), that is, the selection of ring structure such as benzene ring, naphthalene ring or anthracene ring and the kind and number of substituent on the ring.

The anti-reflective coating formed from the anti-reflective coating forming composition according to the present invention has an attenuation coefficient k to a light at a wavelength of 248 nm ranging from 0.40 to 0.65, or 0.40 to 0.60, or 0.45 to 0.65, or to a light at a wavelength of 193 nm ranging from 0.20 to 0.60, or 0.25 to 0.60. And, the anti-reflective coating has an attenuation coefficient k to a light at a wavelength of 157 nm ranging from 0.20 to 0.50 or 0.30 to 0.45 or 0.30 to 0.40.

The anti-reflective coating formed from the composition for forming anti-reflective coating according to the present invention can be used depending on process condition as a coating having the following functions: a function of preventing reflection light, a function of preventing a mutual interaction between a substrate and a photoresist, a function of preventing an adverse effect to a substrate by a material used in the photoresist or a substance generated on exposure to the photoresist, or a function of preventing an adverse effect to a photoresist by a substance generated from the substrate on exposure to light or heating.

Hereinafter, the present invention will be described based on examples and comparative examples but the present invention is not limited thereto.

SYNTHESIS EXAMPLE 1

After 5.0 g of tris-(2,3-epoxypropyl)-isocyanurate (trade name: TEPIC manufactured by Nissan Chemical Industries, Ltd.), 4.8 g of 6-hydroxy-2-naphthalene carboxylic acid and 0.02 g of benzyltriethyl ammonium chloride were dissolved in 39 g of propylene glycol monomethyl ether, the resulting solution was reacted at 130° C. for 24 hours to obtain an oligomer compound solution. The resulting oligomer compound was subjected to GPC analysis and had a weight average molecular weight of 3400 in terms of standard polystyrene.

In the meanwhile, it is assumed that the oligomer compound obtained in this Synthesis Example contains triazine trione compound having substituent of formula (35) and oligomer compound in which triazine trione rings are linked through linking group of formula (52).

SYNTHESIS EXAMPLE 2

After 4.0 g of tris-(2,3-epoxypropyl)-isocyanurate (trade name: TEPIC manufactured by Nissan Chemical Industries, Ltd.), 6.1 g of 6-hydroxy-2-naphthalene. carboxylic acid and 0.02 g of benzyltriethyl ammonium chloride were dissolved in 42 g of propylene glycol monomethyl ether, the resulting solution was reacted at 130° C. for 24 hours to obtain an oligomer compound solution. The resulting oligomer compound was subjected to GPC analysis and had a weight average molecular weight of 1700 in terms of standard polystyrene.

In the meanwhile, it is assumed that the oligomer compound obtained in this Synthesis Example contains triazine trione compound having substituent of formula (35) and oligomer compound in which triazine trione rings are linked through linking group of formula (52).

SYNTHESIS EXAMPLE 3

After 4.0 g of tris-(2,3-epoxypropyl)-isocyanurate (trade name: TEPIC manufactured by Nissan Chemical Industries, Ltd.), 7.2 g of 6-hydroxy-2-naphthalene carboxylic acid and 0.02 g of benzyltriethyl ammonium chloride were dissolved in 45 g of propylene glycol monomethyl ether, the resulting solution was reacted at 130° C. for 24 hours to obtain an oligomer compound solution. The resulting oligomer compound was subjected to GPC analysis and had a weight average molecular weight of 1200 in terms of standard polystyrene.

In the meanwhile, it is assumed that the oligomer compound obtained in this Synthesis Example contains triazine trione compound having substituent of formula (35) and oligomer compound in which triazine trione rings are linked through linking group of formula (52).

SYNTHESIS EXAMPLE 4

After 1.7 g of tris-(2,3-epoxypropyl)-isocyanurate (trade name: TEPIC manufactured by Nissan Chemical Industries, Ltd.), 3.4 g of 6-hydroxy-2-naphthalene carboxylic acid and 0.09 g of benzyltriethyl ammonium chloride were dissolved in 20 g of propylene glycol monomethyl ether, the resulting solution was reacted at 130° C. for 24 hours to obtain an oligomer compound solution. The resulting oligomer compound was subjected to GPC analysis and-had a weight average molecular weight of 1200 in terms of standard polystyrene.

In the meanwhile, it is assumed that the oligomer compound obtained in this Synthesis Example contains triazine trione compound having substituent of formula (35) and oligomer compound in which triazine trione rings are linked through linking group of formula (52).

SYNTHESIS EXAMPLE 5

After 21 g of glycidylmethacrylate and 39 g of 2-hydroxypropylmethacrylate were dissolved in 242 g of propylene glycol monomethyl ether, the temperature of the resulting solution was raised to 70° C., and then 0.6 g of azobisisobutyronitrile was added thereto while the reaction solution was kept at 70° C., and the resulting solution was reacted at 70° C. for 24 hours to obtain a solution of copolymerized polymer compound of glycidylmethacrylate and 2-hydroxypropylmethacrylate. The resulting polymer compound was subjected to GPC analysis and had a weight average molecular weight of 50000 in terms of standard polystyrene.

To 100 g of a solution containing 20 g of the copolymerized polymer compound, 10 g of 9-anthracene carboxylic acid, 0.3 g of benzyltriethylammonium chloride and 41 g of propylene glycol monomethyl ether were added, and the resulting solution was reacted at 130° C. for 24 hours to obtain a compound of formula (60). In formula (60), m is a molar ratio of constitutional unit, and n+m=1.

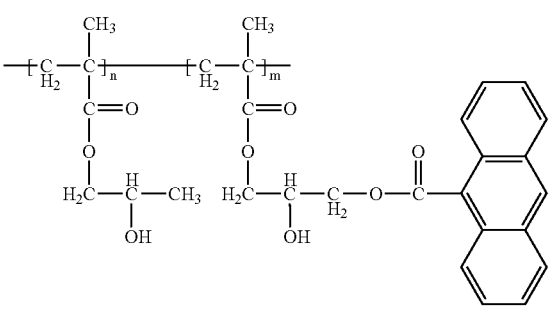

SYNTHESIS EXAMPLE 6

After 0.70 g of tris-(2,3-epoxypropyl)-isocyanurate (trade name: TEPIC manufactured by Nissan Chemical Industries, Ltd.), 2.44 g of 2,4,6-tribromo-3-hydroxy benzoic acid and 0.04 g of benzyltriethyl ammonium chloride were dissolved in 12.72 g of propylene glycol monomethyl ether, the atmosphere was replaced with nitrogen and then the resulting solution was reacted at 125° C. for 24 hours to obtain an oligomer compound solution. The resulting oligomer compound was subjected to GPC analysis and had a weight average molecular weight of 1300 in terms of standard polystyrene.

In the meanwhile, it is assumed that the oligomer compound obtained in this Synthesis Example contains triazine trione compound having substituent of formula (30) and oligomer compound in which triazine trione rings are linked through linking group of formula (45).

SYNTHESIS EXAMPLE 7

After 2.0 g of tris-(2,3-epoxypropyl)-isocyanurate (trade name: TEPIC manufactured by Nissan Chemical Industries, Ltd.), 6.70 g of 3,5-diiodo-2-hydroxy benzoic acid and 0.115 g of benzyltriethyl ammonium chloride were dissolved in 35.25 g of propylene glycol monomethyl ether, the atmosphere was replaced with nitrogen and then the resulting solution was reacted at 125° C. for 24 hours to obtain an oligomer compound solution. The resulting oligomer compound was subjected to GPC analysis and had a weight average molecular weight of 2000 in terms of standard polystyrene.

In the meanwhile, it is assumed that the oligomer compound obtained in this Synthesis Example contains triazine trione compound having substituent of formula (32) and oligomer compound in which triazine trione rings are linked through linking group of formula (46).

SYNTHESIS EXAMPLE 8

After 2.0 g of monoallyldiglycidyl isocyanuric acid and 1.2 g of monoallyl isocyanuric acid were dissolved in 13.2 g of cyclohexanone, the temperature of the reaction solution was raised to 120° C., and simultaneously nitrogen was flushed. Thereafter, 0.08 g of benzyltriethyl ammonium chloride as catalyst was added thereto, and the resulting mixture was stirred under nitrogen atmosphere for 21 hours. The resulting reaction product was subjected to GPC analysis and had a weight average molecular weight of 5800 in terms of standard polystyrene.

In the meanwhile, it is assumed that the reaction product obtained in this Synthesis Example contains a compound having the constitutional unit of formula (61).

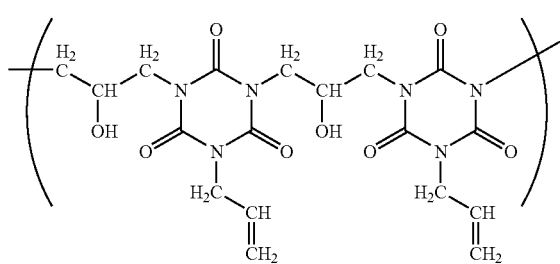

(61)

SYNTHESIS EXAMPLE 9

After 2.0 g of monoallyidiglycidyl isocyanuric acid and 1.5 g of monophenyl isocyanuric acid were dissolved in 14.2 g of cyclohexanone, the temperature of the reaction solution was raised to 120° C., and simultaneously nitrogen was flushed. Thereafter, 0.08 g of benzyltriethyl ammonium chloride as catalyst was added thereto, and the resulting mixture was stirred under nitrogen atmosphere for 19 hours. The resulting reaction product was subjected to GPC analysis and had a weight average molecular weight of 2400 in terms of standard polystyrene.

In the meanwhile, it is assumed that the reaction product obtained in this Synthesis Example contains a compound having the constitutional unit of formula (62).

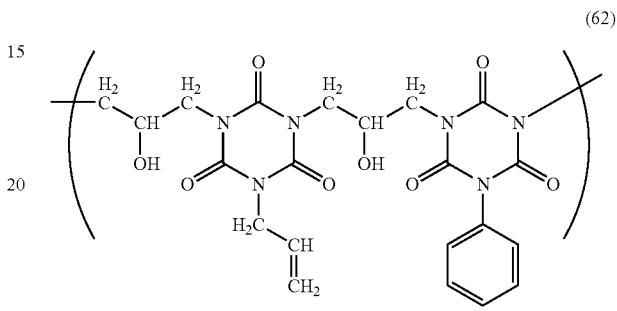

(62)

SYNTHESIS EXAMPLE 10

After 2.0 g of monoallyldiglycidyl isocyanuric acid and 1.0 g of monomethyl isocyanuric acid were dissolved in 12.4 g of cyclohexanone, the temperature of the reaction solution was raised to 120° C., and simultaneously nitrogen was flushed. Thereafter, 0.08 g of benzyltriethyl ammonium chloride as catalyst was added thereto, and the resulting mixture was stirred under nitrogen atmosphere for 19 hours to obtain a solution containing a reaction product.

In the meanwhile, it is assumed that the reaction product obtained in this Synthesis Example contains a compound having the constitutional unit of formula (63).

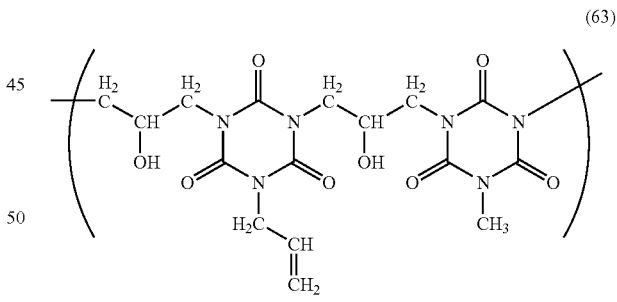

(63)

SYNTHESIS EXAMPLE 11

After 2.0 g of monoallyldiglycidyl isocyan.uric acid and 2.2 g of monomethyidicarboxybutyl isocyanurate were dissolved in 17.4 g of cyclohexanone, the temperature of the reaction solution was raised to 120° C., and simultaneously nitrogen was flushed. Thereafter, 0.08 g of benzyltriethyl ammonium chloride as catalyst was added thereto, and the resulting mixture was stirred under nitrogen atmosphere for 19 hours. The resulting reaction product was subjected to GPC analysis and had a weight average molecular weight of 12200 in terms of standard polystyrene.

In the meanwhile, it is assumed that the reaction product obtained in this Synthesis Example contains a compound having the constitutional unit of formula (64).

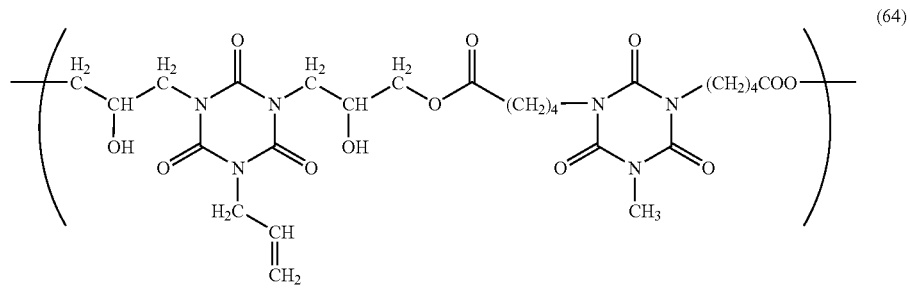

(64)

SYNTHESIS EXAMPLE 12

After 0.50 g of tris-(2,3-epoxypropyl)-isocyanurate (trade name: TEPIC manufactured by Nissan Chemical Industries, Ltd.) and 1.2 g of monocarboxypropyldimethyl isocyanurate were dissolved in 7.0 g of dimethylformamide, the temperature of the reaction solution was raised to 120° C. and simultaneously nitrogen was flushed to the reaction solution. Thereafter, 0.03 g of benzyltriethyl ammonium chloride as catalyst was added thereto, and the resulting mixture was stirred under nitrogen atmosphere for 20 hours to obtain a solution containing a reaction product of formula (65).

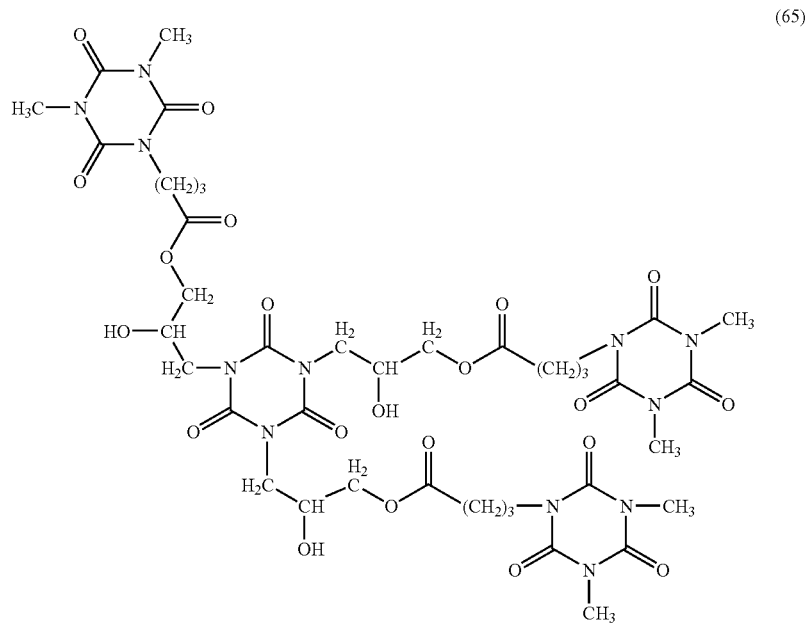

(65)

SYNTHESIS EXAMPLE 13

After 1.8 g of tris-(2,3-epoxypropyl)-isocyanurate (trade name: TEPIC manufactured by Nissan Chemical Industries, Ltd.) and 4.0 g of monocarboxymethyl dimethyl isocyanurate were dissolved in 23.8 g of cyclohexanone, the temperature of the reaction solution was raised to 120° C. and simultaneously nitrogen was flushed to the reaction solution. Thereafter, 0.1 g of benzyltriethyl ammonium chloride as catalyst was added thereto, and the resulting mixture was stirred under nitrogen atmosphere for 20 hours to-obtain a solution containing a reaction product of formula (66).

(66)

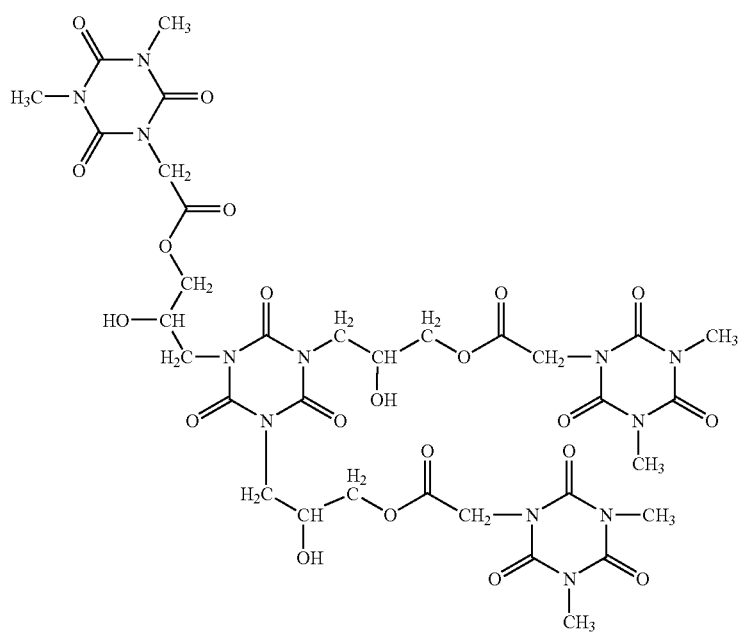

SYNTHESIS EXAMPLE 14

10 g of cresol novolak resin (trade name: ECN 1299 manufactured by Asahi Chiba Co., Ltd., weight average molecular weight: 3900) was added to 80 g of propylene glycol monomethyl ether, and dissolved therein. To the solution, 9.7 g of 9-anthracene carboxylic acid and 0.26 g of benzyltriethyl ammonium chloride were added and the resulting solution was reacted at 105° C. for 24 hours to obtain a resin compound of formula (67). The resulting resin compound was subjected to GPC analysis and had a weight average molecular weight of 5600 in terms of standard polystyrene.

(67)

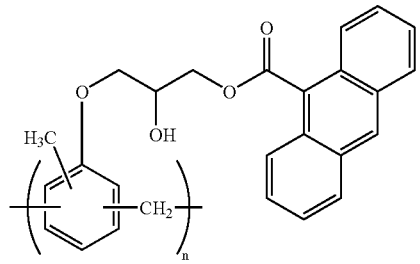

SYNTHESIS EXAMPLE 15

After 6.8 g of tris-(2,3-epoxypropyl)-isocyanurate (trade name: TEPIC manufactured by Nissan Chemical Industries, Ltd.), 12.9 g of 3,7-dihydroxy-2-naphthalene carboxylic acid and 0.37 g of benzyltriethyl ammonium chloride were dissolved in 80 g of cyclohexanone, the resulting solution was reacted at 130° C. for 24 hours to obtain an oligomer compound solution. The resulting oligomer compound was subjected to GPC analysis and had a weight average molecular weight of 1400 in terms of standard polystyrene. In the meanwhile, it is assumed that the oligomer compound obtained in this Synthesis Example contains triazine trione compound having substituent of formula (37) and oligomer compound in which triazine trione rings are linked through linking group of formula (53).

SYNTHESIS EXAMPLE 16

After 30 g of trifluoroethylmethacrylate, 12.3 g of methacrylic acid and 4.6 g of 2-hydroxypropylmethacrylate were dissolved in 201 g of propylene glycol monomethyl ether, the temperature of the resulting solution was raised to 60° C., and then 3.3 g of 2,2'-azobis(4-methoxy-2,4-dimethylvaleronitrile) was added thereto while the reaction solution was kept at 60° C., and the reaction solution was reacted at 60° C. for 24 hours. The reaction solution was added dropwise to a mixed solvent of water and ethanol, and the precipitate separated out was filtered off to obtain a copolymerized polymer compound of trifluoroethylmethacrylate, methacrylic acid and 2-hydroxypropylmethacrylate. The resulting polymer compound was subjected to GPC analysis and had a weight average molecular weight of 15000 in terms of standard polystyrene.

SYNTHESIS EXAMPLE 17

After 30 g of trichloroethytmethacrylate and 4.5 g of 2-hydroxypropylmethacrylate were dissolved in 145 g of propylene glycol monomethyl ether, the temperature of the resulting solution was raised to 60° C., and then 1.7 g of 2,2'-azobis (4-methoxy-2,4-dimethylvaleronitrile) was added thereto while the reaction solution was kept at 60° C., and the reaction solution was reacted at 60° C. for 24 hours. The reaction solution was added dropwise to a mixed solvent of water and ethanol, and the precipitate separated out was filtered off to obtain a copolymerized polymer compound of trichloroethylmethacrylate and 2-hydroxypropylmethacrylate. The resulting polymer compound was subjected to GPC analysis and had a weight average molecular weight of 11000 in terms of standard polystyrene.

SYNTHESIS EXAMPLE 18

After 21 g of glycidylmethacrylate and 39 g of 2-hydroxypropylmethacrylate were dissolved in 242 g of propylene glycol monomethyl ether, the temperature of the resulting solution was raised to 70° C., and then 0.6 g of azobisisobutyronitrile was added thereto while the reaction solution was kept at 70° C. Then, the reaction solution was reacted at 70° C. for 24 hours to obtain a solution of copolymerized polymer compound of glycidylmethacrylate and 2-hydroxypropylmethacrylate. The resulting polymer compound was subjected to GPC analysis and had a weight average molecular weight of 50000 in terms of standard polystyrene. To 100 g of a solution containing 20 g of the polymer compound, 10 g of 9-anthracenecarboxylic acid, 0.3 g of benzyltriethyl ammonium chloride and 41 g of propylene glycol monomethyl ether were added, the resulting solution was reacted at 130° C. for 24 hours to a solution of polymer compound of formula (68).

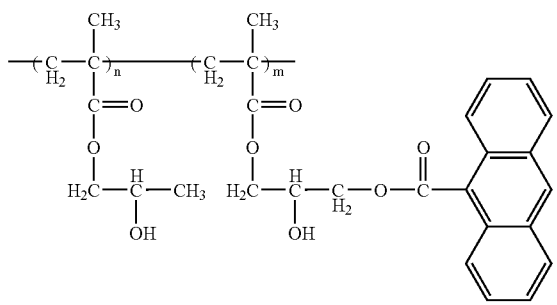

(68)

EXAMPLE 1

To 10 g of a solution containing 2 g of the oligomer compound obtained in Synthesis Example 1, 0.3 g of hexamethoxymethylmelamine (trade name: Cymel 303; manufactured by Mitsui Cytec Co., Ltd.) and 0.03 g of pyridinium-p-toluenesulfonic acid were mixed, and the resulting mixture was dissolved in 20 g of propylene glycol monomethyl ether and 28 g of ethyl lactate to obtain a solution. Then, the solution was filtered through a micro filter made of polyethylene having a pore diameter of 0.10 μm, and then, the solution was filtered through a micro filter made of polyethylene having a pore diameter of 0.-05 μm, to prepare a composition solution for forming anti-reflective coating.

EXAMPLE 2

To 10 g of a solution containing 2 g of the oligomer compound obtained in Synthesis Example 2, 0.3 g of hexamethoxymethylmelamine (trade name: Cymel 303; manufactured by Mitsui Cytec Co., Ltd.) and 0.03 g of pyridinium-p-toluenesulfonic acid were mixed, and the resulting mixture was dissolved in 20 g of propylene glycol monomethyl ether and 28 g of ethyl lactate to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 3

To 10 g of a solution containing 2 g of the oligomer compound obtained in Synthesis Example 3, 0.3 g of hexamethoxymethylmelamine (trade name: Cymel 303; manufactured by Mitsui Cytec Co., Ltd.) and 0.03 g of pyridinium-p-toluenesulfonic acid were mixed, and the resulting mixture was dissolved in 20 g of propylene glycol monomethyl ether and 28 g of ethyl lactate to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 4

To 10 g of a solution containing 2 g of the polymer compound obtained in Synthesis Example 4, 0.5 g of tetramethoxymethyl glycol uril (trade name: Powderlink 1174; manufactured by Mitsui Cytec Co., Ltd.) and 0.05 g of pyridinium-p-toluenesulfonic acid were mixed, and the resulting mixture was dissolved in 23 g of propylene glycol monomethyl ether and 31 g of ethyl lactate to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 5

To 10 g of a solution containing 2 g of the oligomer compound obtained in Synthesis Example 6, 0.5 g of tetramethoxymethyl glycol uril and 0.05 g of pyridinium-p-toluenesulfonic acid were mixed, and 56.7 g of propylene glycol monomethyl ether was added thereto to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 6

To 10 g of a solution containing 2 g of the oligomer compound obtained in Synthesis Example 7, 0.5 g of tetramethoxymethyl glycol uril and 0.05 g of pyridinium-p-toluenesulfonic acid were mixed, and 56.7 g of propylene glycol monomethyl ether was added thereto to obtain a solution. Then, the solution was filtered through a micro filter made of polyethylene having a pore diameter of 0.10 μm, and then, the solution was filtered through a micro. filter made of polyethylene having a pore diameter of 0.05 μm, to prepare a composition solution for forming anti-reflective coating.

EXAMPLE 7

To 6 g of a solution containing 1.2 g of the reaction product obtained in Synthesis Example 8, 0.3 g of hexamethoxymethylmelamine and 0.03 g of p-toluenesulfonic acid were mixed, and 23.7 g of ethyl lactate was added thereto. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 8 TO 12

Similarly to the above-mentioned procedure, to 6 g of a solution containing 1.2 g of the reaction product obtained in Synthesis Examples 9 to 13, 0.3 g of hexamethoxymethylmelamine and 0.03 g of p-toluenesulfonic acid were mixed, and 23.7 g of ethyl lactate was added thereto. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 13

To 10 g of a solution containing 2 g of the oligomer compound obtained in Synthesis Example 15, 0.5 g of tetrabutoxymethyl glycol uril (trade name: Cymel 1170; manufactured by Mitsui Cytec Co., Ltd.), 0.05 g of pyridinium-p-toluenesulfonic acid, 20 g of propylene glycol monomethyl ether, 59 g of ethyl lactate and 12 g of cyclohexanone were added to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 14

To 10 g of a solution containing 2 g of the oligomer compound obtained in Synthesis Example 15, 0.4 g of tetrabutoxymethyl glycol uril (trade name: Cymel 1170; manufactured by Mitsui Cytec Co., Ltd.), 0.1 g of hexamethoxymethylmelamine (trade name: Cymel 303; manufactured by Mitsui Cytec Co., Ltd.), 0.05 g of pyridinium-p-toluenesulfonic acid, 16 g of propylene glycol monomethyl ether, 49 g of ethyl lactate and 8 g of cyclohexanone were added to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 15

To 10 g of a solution containing 2 g of the oligomer compound obtained in Synthesis Example 15, 0.3 g of tetrabutoxymethyl glycol uril (trade name: Cymel 1170; manufactured by Mitsui Cytec Co., Ltd.), 0.2 g of hexamethoxymethylmelamine (trade name: Cymel 303; manufactured by Mitsui Cytec Co., Ltd.), 0.05 g of pyridinium-p-toluenesulfonic acid, 16 g of propylene glycol monomethyl ether, 49 g of ethyl lactate and 8 g of cyclohexanone were added to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 16

To 10 g of a solution containing 2 g of the oligomer compound obtained in Synthesis Example 15, 2.0 g of tetrabutoxymethyl glycol uril (trade name: Cymel 1170; manufactured by Mitsui Cytec Co., Ltd.), 0.2 g of pyridinium-p-toluenesulfonic acid, 14 g of propylene glycol monomethyl ether, 43 g of ethyl lactate and 6 g of cyclohexanone were added to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 17

To 10 g of a solution containing 2 g of the oligomer compound obtained in Synthesis Example 15, 0.5 g of tetrabutoxymethyl glycol uril (trade name: Cymel 1170; manufactured by Mitsui Cytec Co., Ltd.), 0.05 g of 5-sulfosalicylic acid, 12 g of propylene glycol monomethyl ether, 37 g of ethyl lactate and 4 g of cyclohexanone were added to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 18

To 10 g of a solution containing 2 g of the oligomer compound obtained in Synthesis Example 15, 0.5 g of tetrabutoxymethyl glycol uril (trade name: Cymel 1170; manufactured by Mitsui Cytec Co., Ltd.), 0.09 g of dinonylnaphthalene sulfonate, 12 g of propylene glycol monomethyl ether, 37 g of ethyl lactate and 4 g of cyclohexanone were added to obtain a solution. Then, the solution was filtered through a micro filter made of polyethylene. having a pore diameter of 0.10 μm, and then, the solution was filtered through a micro filter made of polyethylene having a pore diameter of 0.05 μm, to prepare a composition solution for forming anti-reflective coating.

EXAMPLE 19

To 10 g of a solution containing 2 g of the oligomer compound obtained in Synthesis Example 15, 2.0 g of tetrabutoxymethyl glycol uril (trade name: Cymel 1170; manufactured by Mitsui Cytec Co., Ltd.), 0.05 g of pyridinium-p-toluenesulfonic acid, 0.09 g of the polymer compound obtained in Synthesis Example 16, 10 g of propylene glycol monomethyl ether, 30 g of ethyl lactate and 2 g of cyclohexanone were added to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 20

To 10 g of a solution containing 2 g of the oligomer compound obtained in Synthesis Example 15, 0.5 g of tetrabutoxymethyl glycol uril (trade name: Cymel 1170; manufactured by Mitsui Cytec Co., Ltd.), 0.05 g of pyridinium-p-toluenesulfonic acid, 0.18 g of the polymer compound obtained in Synthesis Example 17, 10 g of propylene glycol monomethyl ether, 30 g of ethyl lactate and 2 g of cyclohexanone were added to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

EXAMPLE 21

To 10 g of a solution containing 2 g of the oligomer compound obtained in Synthesis Example 15, 0.8 g of tris-(2,3-epoxypropyl)-isocyanurate (trade name: TEPIC manufactured by Nissan Chemical Industries, Ltd.), 39 g of propylene glycol monomethyl ether and 47 g of propylene glycol monomethylether acetate were added to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

Comparative Example 1

To 10 g of a solution containing 2 g of the polymer compound obtained in Synthesis Example 5, 0.5 g of tetramethoxymethyl glycol uril (trade name: Powderlink 1174; manufactured by Mitsui Cytec Co., Ltd.) and 0.03 g of p-toluenesulfonic acid were mixed. The resulting solution was dissolved in 37.3 g of propylene glycol monomethyl ether and 19.4 g of cyclohexanone to obtain a solution. Then, the solution was filtered through a micro filter made of polyethylene having a pore diameter of 0.10 μm, and then, the solution was filtered through a micro filter made of polyethylene having a pore diameter of 0.05. μm, to prepare a composition solution for forming anti-reflective coating.

Comparative Example 2

To 10 g of a solution containing 2 g of the resin obtained in Synthesis Example 14, 0.53 g of hexamethoxymethylmelamine and 0.05 g of p-toluenesulfonic acid monohydrate were mixed. The resulting solution was dissolved in 14.3 g of ethyl lactate, 1.13 g of propylene glycol monomethyl ether and 2.61 g of cyclohexanone to obtain 9% solution. Then, the solution was filtered through a micro filter made of polyethylene having a pore diameter of 0.10 μm, and then, the solution was filtered through a micro-filter made of polyethylene having a pore diameter of 0.05 μm, to prepare a composition solution for forming anti-reflective coating.

Comparative Example 3

To 10 g of a solution containing 2 g of the polymer compound obtained in Synthesis Example 18, 0.3 g of hexamethoxymethylmelamine, 0.01 g of p-toluenesulfonic acid, 37.3 g of propylene glycol monomethyl ether and 19.4 g of propylene glycol monomethyl ether acetate were added to obtain a solution. Then, the solution was filtered through a micro filter made of polyethylene having a pore diameter of 0.10 μm, and then, the solution was filtered through a micro filter made of polyethylene having a pore diameter of 0.05 μm, to prepare a composition solution for forming anti-reflective coating.

Dissolution Test in Solvent for Photoresist

The composition solutions for forming anti-reflective coating obtained in Examples 1 to 21 and Comparative Examples 1 to 3 were coated on silicon wafers by means of a spinner. The coated silicon wafers were heated at 205° C. for 1 minute on a hot plate to form anti-reflective coatings (film thickness 0.10 μm). The anti-reflective coatings were dipped in a solvent used for resists, for example ethyl lactate and propylene glycol monomethyl ether and as a result it was confirmed that the resulting coatings were insoluble in these solvents.

Test of Intermixing with Photoresist

The composition solutions for forming anti-reflective coating obtained in Examples 1 to 6, 13 to 21 and Comparative Examples 1 and 3 were coated on silicon wafers by means of a spinner. The coated silicon wafers were heated at 205° C. for 1 minute on a hot plate to form anti-reflective coatings (film thickness 0.10 μm). On each anti-reflective coating was coated a commercially available photoresist solution (manufactured by Shipley Company; trade name: UV113, etc.) by means of a spinner. The coated wafers were heated at 120° C. for 1 minute on a hot plate. After exposure of the resists to light, post exposure bake (PEB) was performed at 115° C. for 1.5 minute. After developing the photoresists, the film thickness of the anti-reflective coatings was measured and it was confirmed that no intermixing occurred between the anti-reflective coatings for lithography obtained from anti-reflective coating solutions prepared in Examples 1 to 6, 13 to 21 and Comparative Examples 1 and 3 and the photoresist layers.

Similarly, on each anti-reflective coating (film thickness 0.23 μm) formed from the composition solutions for forming anti-reflective coating obtained in Examples 7 to 9 and Comparative Example 2 was coated a commercially available photoresist solution (manufactured by Sumitomo Chemical Co., Ltd.; trade name: PAR710) by means of a spinner. The coated wafers were heated at 90° C. for 1 minute on a hot plate. After exposure of the resists to light, post exposure bake (PEB) was performed at 90° C. for 1.5 minute. After developing the photoresists, the film thickness of the anti-reflective coatings was measured and it was confirmed that no intermixing occurred between the anti-reflective coatings obtained from anti-reflective coating solutions prepared in Examples 7 to 9 and Comparative Example 2 and the photoresist layers.

Test on Optical Parameter

The composition solutions for forming anti-reflective coating obtained in Examples 1 to 4, 13 to 21 and Comparative Examples 1 and 3 were coated on silicon wafers by means of a spinner. The coated silicon wafers were heated at 205° C. for 1 minute on a hot plate to form anti-reflective coatings (film thickness 0.06 μm). On each anti-reflective coating, refractive index (n) and attenuation coefficient (k) at a wavelength of 248 nm were measured with a spectroscopic ellipsometer. The results of the measurement are shown in Tables 2 and 5.

The composition solutions for forming anti-reflective coating obtained in Examples 5 and 6 were coated on silicon wafers by means of a spinner. The coated silicon wafers were heated at 205° C. for 1 minute on a hot plate to form anti-reflective coatings (film thickness 0.06 μm). On each anti-reflective coating, refractive index (n) and attenuation coefficient (k) at a wavelength of 157 nm were measured with a spectroscopic ellipsometer (manufactured by J. A. Woollam Co., VUV-VASE VU-302). The results of the measurement are shown in Table 3.

The composition solutions for forming anti-reflective coating obtained in Examples 7 to 12 and Comparative Example 2 were coated on silicon wafers by means of a spinner. The coated silicon wafers were heated at 205° C. for 1 minute on a hot plate to form anti-reflective coatings (film thickness 0.09 μm). On each anti-reflective coating, refractive index (n) and attenuation coefficient (k) at a wavelength of 193 nm were measured with a spectroscopic ellipsometer. The results of the measurement are shown in Table 4.

Measurement of Dry Etching Rate

The composition solutions for forming anti-reflective coating obtained in Examples 1 to 21 and Comparative Examples 1 to 3 were coated on silicon wafers by means of a spinner. The coated silicon wafers were baked at 205° C. for 1 minute on a hot plate to form anti-reflective coatings. Then, dry etching rate on each anti-reflective coating was measured with RIE system ES401 manufactured by Nippon Scientific Co., Ltd. under the condition in which CF was used as dry etching gas.

Similarly, a photoresist solution (trade name: UV113 manufactured by Shipley Company and trade name: PAR710 manufactured by Sumitomo Chemical Co., Ltd.) was coated on silicon wafers by means of a spinner. Then, dry etching rate on each photoresist was measured with RIE system ES401 manufactured by Nippon Scientific Co., Ltd. under the condition in which CF was used as dry etching gas. The dry etching rate on the anti-reflective coatings in Examples 1 to 4, 13 to 21 and Comparative Examples 1 and 3 was compared with that on the photoresist (trade name: UV113) manufactured by Shipley Company. The results of the measurement are shown in Tables 2 and 5. The dry etching rate on the anti-reflective coatings in Examples 5 to 12 and Comparative Example 2 was compared with that on the photoresist (trade name: PAR710) manufactured by Sumitomo Chemical Co., Ltd. The results of the measurement are shown in Tables 3 and 4.

Simulation of the First Minimum Film Thickness

The first minimum film thickness and the reflection rate in case where an anti-reflective coating was used in the first minimum film thickness were determined by simulation calculation with the refractive index (n) and the attenuation coefficient (k) at a wavelength of 248 nm of the anti-reflective coatings for lithography prepared from the composition solutions for forming anti-reflective coating obtained in Examples 1 to 4, 13 to 21 and Comparative Examples 1 and 3. In this case, for the simulation PROLITH/2 manufactured by FINLE Technologies Inc. was used. The results are shown in Tables 2 and 5.

TABLE 2

|  | Refractive index (n) | Attenuation coefficient (k) | First minimum film thickness (nm) | Reflection rate (%) | Selection ratio* |
|---|---|---|---|---|---|
| Example 1 | 1.80 | 0.50 | 41 | <0.1 | 1.4 |
| Example 2 | 1.80 | 0.52 | 41 | <0.1 | 1.3 |
| Example 3 | 1.79 | 0.54 | 41 | <0.1 | 1.3 |
| Example 4 | 1.81 | 0.50 | 41 | <0.1 | 1.5 |
| Comparative Example 1 | 1.48 | 0.47 | 59 | 0.2 | 1.3 |

*"Section ratio" means dry etching rate selection ratio to photoresist.

TABLE 3

|  | Refractive index (n) | Attenuation coefficient (k) | Dry etching rate selection ratio to photoresist |
|---|---|---|---|
| Example 5 | 1.75 | 0.36 | 2.47 |
| Example 6 | 1.61 | 0.41 | 2.08 |

TABLE 4

|  | Refractive index (n) | Attenuation coefficient (k) | Dry etching rate selection ratio to photoresist |
|---|---|---|---|
| Example 7 | 2.03 | 0.44 | 1.85 |
| Example 8 | 1.95 | 0.59 | 1.60 |
| Example 9 | 2.03 | 0.48 | 2.04 |
| Example 10 | 1.97 | 0.29 | 1.85 |
| Example 11 | 1.96 | 0.28 | 2.08 |
| Example 12 | 1.99 | 0.27 | 2.45 |
| Comparative Example 2 | 1.60 | 0.47 | 0.88 |

TABLE 5

|  | Refractive index (n) | Attenuation coefficient (k) | First minimum film thickness (nm) | Reflection rate (%) | Selection ratio* |
|---|---|---|---|---|---|
| Example 13 | 1.82 | 0.59 | 39 | <1 | 1.4 |
| Example 14 | 1.82 | 0.61 | 38 | <1 | 1.4 |
| Example 15 | 1.84 | 0.61 | 38 | <1 | 1.4 |
| Example 16 | 1.77 | 0.45 | 44 | <1 | 1.6 |
| Example 17 | 1.80 | 0.58 | 40 | <1 | 1.4 |
| Example 18 | 1.81 | 0.57 | 40 | <1 | 1.4 |
| Example 19 | 1.79 | 0.59 | 42 | <1 | 1.4 |
| Example 20 | 1.79 | 0.57 | 42 | <1 | 1.4 |
| Example 21 | 1.82 | 0.59 | 39 | <1 | 1.5 |
| Comparative Example 3 | 1.50 | 0.48 | 57 | <1 | 1.3 |

*"Section ratio" means dry etching rate selection ratio to photoresist.

From the above-mentioned results, it is understood that the anti-reflective coatings prepared from the composition for forming anti-reflective coating according to the present invention have a satisfactorily effective refractive index and attenuation coefficient for a light of a wavelength of 248 nm (Examples 1 to 4 and 13 to 21), a wavelength of 157 nm (Examples 5 and 6), and a wavelength of 193 nm (Examples 7 to 12).

In addition, it is understood that they have a high selection ratio of dry etching rate to photoresist (Examples 1 to 21). Further, it is understood that they exerts a high protection effect against light reflection compared with the prior anti-reflective coating, and that they can be used in thinner film (Comparison between Examples 1 to 4 and Comparative Example 1, and between Examples 13 to 21 and Comparative Example 3). Consequently, it is concluded that the composition according to the present invention makes possible to reduce the time required for removal of anti-reflective coatings by dry etching, therefore it can prevent adverse phenomenon that film thickness of photoresist would be reduced with the removal of anti-reflective coatings by dry etching.

As mentioned above, the present invention can provide an anti-reflective coating forming composition for forming an excellent bottom organic anti-reflective coating that has a good absorption of light at a wavelength utilized for manufacturing a semiconductor device, that exerts a high protection effect against light reflection, that has a high dry etching rate compared with the photoresist layer, that causes no intermixing with the photoresist layer, and that occurs no diffusion to the photoresist upon heating and drying.

The invention claimed is:

1. A composition for forming anti-reflective coating characterized in that the composition comprises a triazine trione oligomer compound having hydroxyalkyl structure as substituent on nitrogen atom, or a triazine trione polymer compound having hydroxyalkyl structure as substituent on nitrogen atom; and wherein the triazine trione oligomer compound having hydroxyalkyl structure as substituent on nitrogen atom, or triazine trione polymer compound having hydroxyalkyl structure as substituent on nitrogen atom is a reaction product of a compound of formula (10) with a compound of formula (11) or (12):

(10)
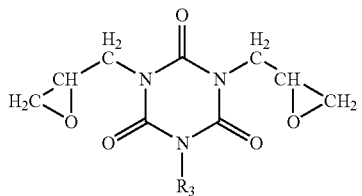
(11)
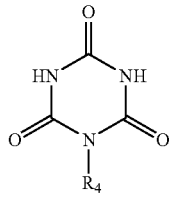
(12)
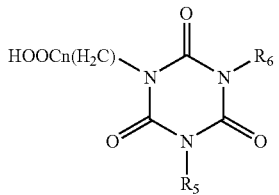
wherein $R_3$ is $C_{1-6}$ alkyl, $C_{3-6}$ alkenyl, phenyl, benzyl or 2,3-epoxypropyl, $R_4$ and $R_5$ are $C_{1-6}$ alkyl, $C_{3-6}$ alkenyl, phenyl or benzyl, $R_6$ is $C_{1-6}$ alkyl, phenyl, benzyl or —$(CH_2)_n$COOH, and n is a number of 1, 2 or 3.
* * * * *